United States Patent [19]
New

[11] Patent Number: 6,154,049
[45] Date of Patent: Nov. 28, 2000

[54] MULTIPLIER FABRIC FOR USE IN FIELD PROGRAMMABLE GATE ARRAYS

[75] Inventor: Bernard J. New, Los Gatos, Calif.

[73] Assignee: Xilinx, Inc., San Jose, Calif.

[21] Appl. No.: 09/049,966

[22] Filed: Mar. 27, 1998

[51] Int. Cl.[7] .................................................. G06F 7/38
[52] U.S. Cl. .............................. 326/39; 326/39; 326/34; 326/37; 326/40; 326/41; 326/44; 326/45
[58] Field of Search ................................. 326/37, 38, 39, 326/40, 41, 45, 44

[56] References Cited

U.S. PATENT DOCUMENTS

| | | | |
|---|---|---|---|
| 5,796,269 | 8/1998 | New | 326/40 |
| 5,880,597 | 3/1999 | Lee | 326/41 |
| 5,898,319 | 4/1999 | New | 326/41 |
| 5,910,732 | 6/1999 | Trimberger | 326/38 |

OTHER PUBLICATIONS

"The Programmable Logic Data Book", published Sep., 1996, available from Xilinx, Inc., 2100 Logic Drive, San Jose, California 95124, pp. 4–5 to 4–96.
"The Programmable Logic Data Book" published 1994, available from Xilinx, Inc., 2100 Logic Drive, San Jose, California 95124, pp. 2–5 to 2–102.

*Primary Examiner*—Michael Tokar
*Assistant Examiner*—Vibol Tan
*Attorney, Agent, or Firm*—Bever, Hoffman & Harms, LLP; E. Eric Hoffman; Lois D. Cartier

[57] ABSTRACT

A programmable logic device, such as a field programmable gate array (FPGA) which includes an array of configurable logic elements (CLEs) and a corresponding array of multiplier tiles. The CLEs can be operated as conventional configurable logic elements, completely disconnected from the array of multiplier tiles. However, selected CLEs can also be coupled to selected multiplier tiles, thereby creating a relatively high density multiplier circuit. Each of the multiplier tiles includes a multiplier array having a predetermined size (e.g., a 2×4 bit multiplier array). The multiplier tiles can be selectively coupled to one another, such that the multiplier arrays are connected to form a relatively large multiplier circuit. The desired multiplier and multiplicand bits are routed into the multiplier tiles from associated CLEs. Similarly, the resulting product bits are routed from the multiplier tiles to associated CLEs. In this manner, the FPGA is capable of implementing a relatively large multiplier circuit in an efficient manner.

24 Claims, 18 Drawing Sheets

|  |  |  | X3 | X2 | X1 | X0 |  |
|---|---|---|---|---|---|---|---|
|  |  | * | Y3 | Y2 | Y1 | Y0 |  |
|  |  |  | X3Y0 | X2Y0 | X1Y0 | X0Y0 | ←—101 |
|  |  | X3Y1 | X2Y1 | X1Y1 | X0Y1 | ---- | ←—102 |
|  | X3Y2 | X2Y2 | X1Y2 | X0Y2 | ---- | ---- | ←—103 |
| X3Y3 | X2Y3 | X1Y3 | X0Y3 | ---- | ---- | ---- | ←—104 |
| P7 | P6 | P5 | P4 | P3 | P2 | P1 | P0 |

FIG. 1A
(PRIOR ART)

|  |  |  | X3 | X2 | X1 | X0 |  |
|---|---|---|---|---|---|---|---|
|  |  | * | Y3 | Y2 | Y1 | Y0 |  |
|  |  |  | X3Y0 | X2Y0 | X1Y0 | X0Y0 | ←—101 |
|  |  | X3Y1 | X2Y1 | X1Y1 | X0Y1 | Ø | ←—102 |
|  | C4 | C3 | C2 | C1 | Ø | Ø |  |
|  | C4 | PP2 | PP1 | PP0 | P1 | P0 |  |
|  | X3Y2 | X2Y2 | X1Y2 | X0Y2 | Ø | Ø | ←—103 |
| C8 | C7 | C6 | C5 | Ø | Ø | Ø |  |
|  | C8 | PP5 | PP4 | PP3 | P2 | P1 | P0 |
|  | X3Y3 | X2Y3 | X1Y3 | X0Y3 | Ø | Ø | Ø | ←—104 |
| C12 | C11 | C10 | C9 | Ø | Ø | Ø | Ø |
| P7 | P6 | P5 | P4 | P3 | P2 | P1 | P0 ←—P |

FIG. 1B
(PRIOR ART)

| FIG. 3A | FIG. 3B |

MULTIPLIER FABRIC FOR USE IN FIELD PROGRAMMABLE GATE ARRAYS

BACKGROUND OF THE INVENTION

1. Field of the Invention

The present invention relates to an architecture for a field programmable gate array (FPGA). More specifically, the present invention relates to an FPGA that includes a plurality of configurable logic blocks (CLBs), each having a configurable logic element (CLE) and an associated multiplier tile.

2. Related Art

FIG. 1A is a representation of the binary multiplication of a 4-bit multiplicand number X with a 4-bit multiplier word Y. Multiplicand number X includes bits X3, X2, X1 and X0 (X3 being the most significant bit and X0 being the least significant bit). Similarly, multiplier word Y includes bits Y3, Y2, Y1 and Y0 (Y3 being the most significant bit and Y0 being the least significant bit). Each bit of multiplicand number X is multiplied by each bit of multiplier word Y as illustrated, thereby creating four partial products 101–104. The first partial product 101 includes each bit of multiplicand number X multiplied by Y0. The second partial product 102 includes each bit of multiplier number X multiplied by Y1. The second partial product 102 is shifted left one place with respect to the first partial product 101, thereby providing the appropriate weight to these partial products. The third and fourth partial products 103 and 104 are created and weighted in a similar manner. The aligned columns of partial products 101–104 are added to create product bits P7–P0. Product bits P7–P0 represent the product P of multiplicand number X and multiplier word Y.

FIG. 1B illustrates the addition of partial products 101–104 in more detail. As illustrated in FIG. 1B, the first and second partial products 101 and 102 are initially added. The values in each column are added, thereby generating six sum signals (C4, PP2, PP1, PP0, P1 and P0) and four carry signals (C1–C4) as illustrated. The sum and carry signals for each column are generated in response to the three input signals associated with the column. The generation of sum and carry signals in response to three generic input signals A, B and C is summarized below in Table 1.

TABLE 1

| A | B | C | SUM | CARRY |
|---|---|---|-----|-------|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Carry signal C1 is the carry result from the addition of X1Y0, X0Y1 and "0". Similarly, carry signal C2 is the carry result from the addition of X2Y0, X1Y1 and C1. Carry signal C3 is the carry result from the addition of X3Y0, X2Y1 and C2. Finally, carry signal C4 is the carry result from the addition of X3Y1, C3 and "0".

Six sum signals (C4, PP2, PP1, PP0, P1 and P0) result from the addition of partial products 101 and 102. Sum signal P0 (which is also product bit P0) is equal to X0Y0. Sum signal P1 (which is also product bit P1) is the sum result of XLY0, X0Yi and "0". Sum signal PP0 is the sum result of X2Y0, X1Y1 and C1. Sum signal PP1 is the sum result of X3Y0, X2Y1 and C2. Sum signal PP2 is the sum result of X3Y1 and C3.

Partial product 103 is added to the six sum signals that result from the addition of partial products 101 and 102. Seven sum signals (C8, PP5, PP4, PP3, P2, P1 and P0) and four carry signals (C5–C8) are generated by this addition operation as illustrated. Partial product 104 is then added to the seven sum signals resulting from the addition of partial products 101, 102 and 103. Sum signals (i.e., the product bits P7–P0) and carry signals C9–C12 are generated during this addition operation as illustrated.

FIG. 2 is a circuit diagram of a conventional 4×4 bit multiplier circuit 200 for implementing the multiplication operation illustrated in FIGS. 1A and 1B. Multiplier circuit 200 includes AND gates 201–216 and adder circuits 221–236. Each of adder circuits 221–236 provides a sum signal and a carry signal in response to three input signals in the manner set forth in Table 1. Each of AND gates 201–216 has a first input terminal which is coupled to receive a selected one of the multiplicand bits X3–X0. Similarly, each of AND gates 201–216 has a second input terminal which is coupled to receive a selected one of the multiplier bits Y3–Y0. AND gates 201–216 operate to multiply the X and Y bits. The truth tables for the logical AND of two bits and the arithmetic product of two bits are identical, the result being a logic "1" value only if both bits have logic "1" values, the result being a logic "0" otherwise. As a result, AND gates 201–216 provide the terms of partial products 101, 102, 103 and 104. More specifically, AND gates 201–204 provide the terms of partial product 101; AND gates 205–208 provide the terms of partial product 102; AND gates 209–212 provide the terms of partial product 103; and AND gates 213–216 provide the terms of partial product 104. The terms of partial products 101–104 are provided to adder circuits 225–236 as illustrated. Note that the terms of partial products 101–104 are shifted down in successive columns, thereby providing the appropriate weighting to the partial products. Adder circuits 221–236 add partial products 101–104 in the manner illustrated in FIG. 1B, thereby creating product bits P7–P0. Adders 221–224 are included for regularity. Since one operand to those adders is zero, they serve only to pass partial product 101 to adders 225–228 where partial product 101 is added to partial product 102. The carry signals C1–C12 and sum signals PP0–PP5 previously described in connection with FIG. 1B are illustrated in FIG. 2, thereby showing the manner in which multiplier circuit 200 implements the multiplication operation of FIG. 1B.

FIG. 3, which includes FIGS. 3A and 3B, is a circuit diagram illustrating the implementation of multiplier circuit 200 in an FPGA. The FPGA includes an array of configurable logic blocks (CLBs), which includes CLBs 301–316. Programmable interconnect resources extend between the CLBs, thereby allowing the illustrated connections to be made. The resources present within each CLB can be configured to implement either a pair of adder circuits or a pair of AND gates. For example, CLB 302 is configured to implement AND gates 201 and 202, and CLB 304 is configured to implement adder circuits 221 and 222. A total of eight CLBs (i.e., CLBs 301–302, 305–306, 309–310 and 313–314) are required to implement AND gates 201–216. A total of eight CLBs (i.e., CLBs 303–304, 307–308, 311–312 and 315–316) are required to implement adder circuits 221–236. As a result, at least sixteen CLBs are required to implement multiplier circuit 200. This typically represents a significant portion of the FPGA resources. As a result, it is fairly inefficient to implement multiplier circuit 200 in an FPGA.

Some FPGAs enable one or more of AND gates 201–202 to be implemented in CLB 304. However, even if both of AND gates 201–202 are implemented in CLB 304, at least eight CLBs are required to implement multiplier circuit 200. Because the number of CLBs required to multiply an N-bit multiplicand by an M-bit multiplier grows in proportion to the product N×M, large multipliers can consume a significant portion of the FPGA resources. In general, multiplier circuits cannot be implemented efficiently in a conventional FPGA because of the relatively large number of CLBs required to form the multiplier circuit.

It would therefore be desirable to have an FPGA which is capable of efficiently performing multiplication operations.

SUMMARY

Accordingly, the present invention provides a programmable logic device, such as an FPGA, which includes an array of configurable logic elements (CLEs) and a corresponding array of multiplier tiles. Each of the CLEs includes circuitry that can be programmed to implement various logic functions. Each of the multiplier tiles includes a dedicated multiplier array having a predetermined size (e.g., a 2×4 bit multiplier array). Programmable interconnect resources can be programmed to selectively connect the CLEs to the multiplier tiles. The programmable interconnect resources can also be programmed to selectively connect the CLEs to one another, and to selectively connect the multiplier tiles to one another. In one embodiment, the programmable interconnect resources include a plurality of multiplexers.

As a result, the CLEs can be operated as conventional configurable logic elements, completely disconnected from the array of multiplier tiles by the programmable interconnect resources.

Alternatively, selected multiplier tiles can be connected to one another by the programmable interconnect resources, thereby creating a relatively high density multiplier circuit. Selected CLEs are coupled to these multiplier tiles, thereby providing an interface to this multiplier circuit. In general, the desired multiplier and multiplicand bits are routed from the CLEs to the multiplier tiles. The resulting product bits are routed from the multiplier tiles to associated CLES. In this manner, the FPGA is capable of implementing a relatively large multiplier circuit in a resource efficient manner.

Various multiplier architectures can be used to form the multiplier tiles. These multiplier architectures can be capable of performing signed and/or unsigned multiplication operations, as well as signed/unsigned multiplication operations. Similarly, carry-propagate or carry-save multiplier architectures can be used. When a carry-save multiplier architecture is used, selected multiplier tiles will provide carry and sum signals that must be added to create the final product bits. In this embodiment, these carry and sum signals are routed into the CLE associated with the multiplier tile, and then added within this CLE.

The present invention will be more fully understood in view of the following description and drawings.

BRIEF DESCRIPTION OF THE DRAWINGS

FIGS. 1A and 1B are representations of the binary multiplication of a 4-bit multiplicand X with a 4-bit multiplier Y;

DETAILED DESCRIPTION

Figure 4:
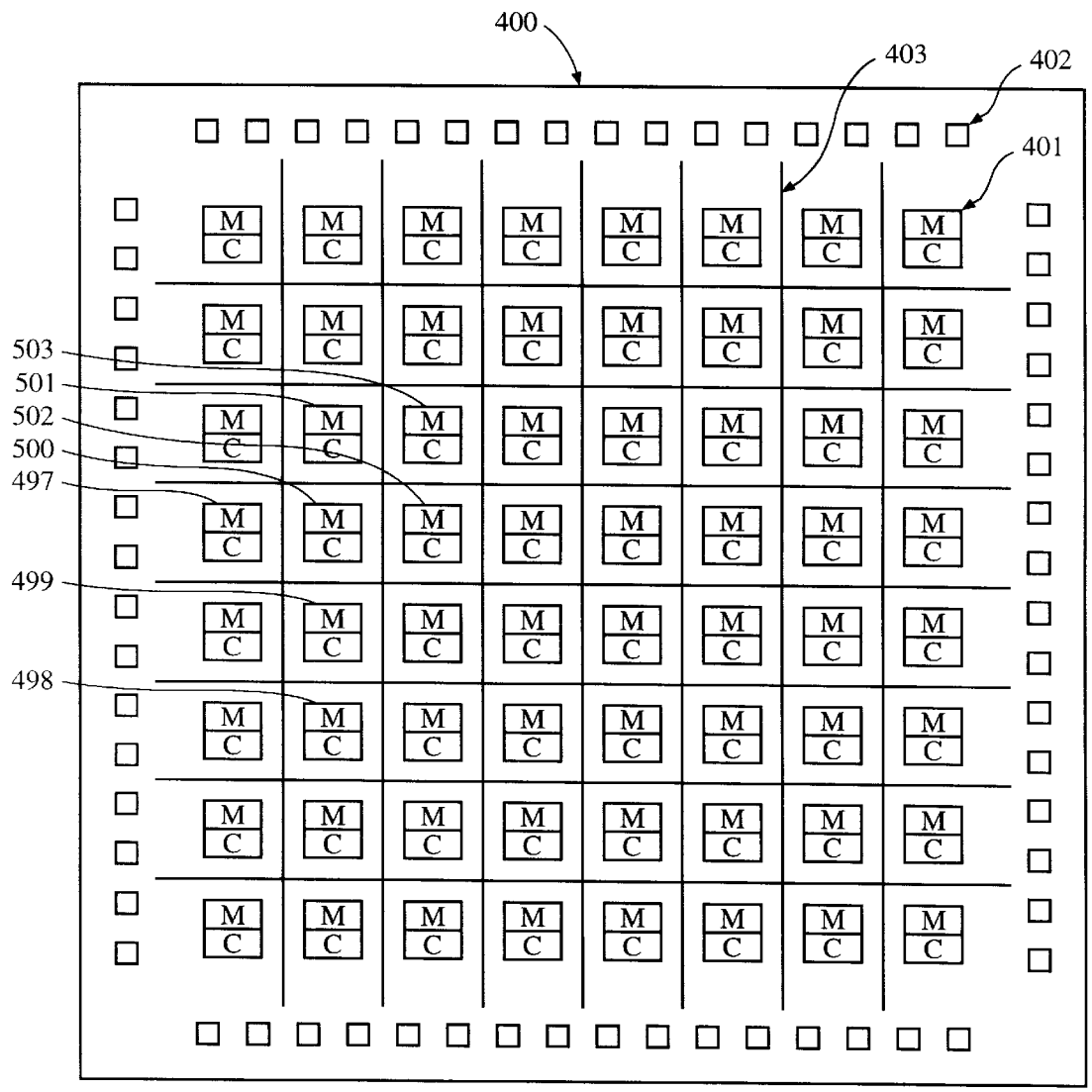
FIG. 4 is a block diagram of a field programmable gate array (FPGA) in accordance with one embodiment of the present invention.

FIG. 4 is a block diagram of a field programmable gate array (FPGA) 400 in accordance with one embodiment of the present invention. FPGA 400 includes a centrally located array 401 of configurable logic blocks (CLBs) and a plurality of programmable input/output blocks (IOBs) 402 located around the perimeter of FPGA 400. CLB array 401 includes a plurality CLBs, such as CLBs 497–503, which are arranged in a plurality of rows and columns. Each of the CLBs in CLB array 401 includes a configurable logic element (CLE) and a multiplier tile. These CLEs and multiplier tiles are labeled with C's and M's, respectively, in FIG. 4. As described in more detail below, programmable interconnect resources 403 extend between the various CLEs, multiplier tiles and IOBs, thereby providing programmable routing paths between these elements.

In general, the CLEs of CLB array 401 provide functional elements for constructing a logic circuit. In addition, these CLEs provide an interface for accessing the multiplier tiles. The multiplier tiles, in turn, are high density multiplier circuits, which can be interconnected to form relatively large multiplier circuits. IOBs 402 provide an interface between the external pins of FPGA 400 and CLB array 401. Customized configuration of FPGA 400 is achieved by programming internal static configuration memory cells that determine the logic functions and interconnections of CLBs 401, 10Bs 402 and programmable interconnect resources 403.

Figure 5:
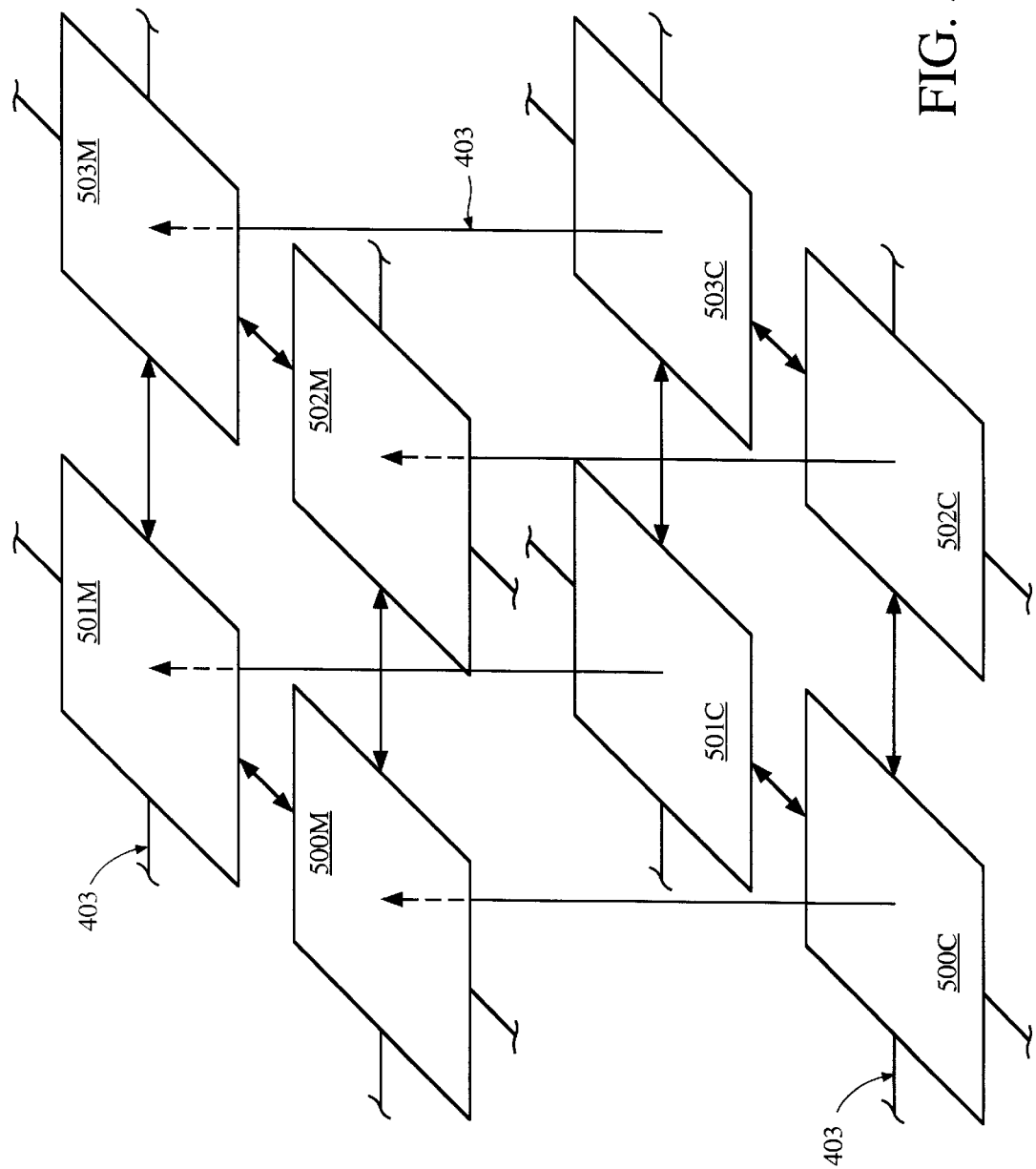
FIG. 5 is a schematic diagram illustrating the programmable interconnect resources coupled to configurable logic blocks (CLBs) in the FPGA of FIG. 4.

FIG. 5 is a schematic diagram illustrating the programmable interconnect resources 403 that are coupled to CLBs 500–503. In FIG. 5, the CLEs associated with CLBs 500–503 are labeled as CLEs 500C–503C, respectively. Similarly, the multiplier tiles associated with CLBs 500–503 are labeled as multiplier tiles 500M–503M.

General purpose programmable interconnect resources 403 extend between CLEs 500C–503C, thereby enabling various CLEs to be coupled to one another after the configuration of the FPGA 400. Although programmable interconnect resources are only shown extending between adjacent CLEs, it is understood that programmable interconnect resources also extend between non-adjacent CLEs. A more detailed description of programmable interconnect resources extending between CLEs is found in *The Programmable Logic Data Book*, (PN0401253) (1994) pp. 2-5 to 2-102, available from Xilinx, Inc., 2100 Logic Drive, San Jose, Calif., and in *The Programmable Logic Data Book*, (PN0010303) (1996) pp. 4-5 to 4-96, also available from Xilinx, Inc., both of which are hereby incorporated by reference. The programmable interconnect resources extending between CLEs is largely conventional, and is therefore not described here in detail.

Dedicated programmable interconnect resources 403 also extend between adjacent multiplier tiles 500M–503M. As described in more detail below, any number of the multiplier tiles can be coupled to form a multiplier circuit. For example, multiplier tiles 500M–503M can be coupled to form a multiplier circuit. In another example, most, if not all, of the multiplier tiles of FPGA 400 can be connected to form a single large multiplier circuit. In another example, a plurality of smaller multiplier circuits can be implemented by selectively coupling smaller groups of multiplier tiles. Each of the multiplier tiles includes dedicated multiplier circuitry. The dedicated nature of this multiplier circuitry results in the multiplier circuits having a relatively high circuit density and speed.

The programmable interconnect circuitry 403 also extends between CLEs 500C–503C and their associated multiplier tiles 500M–503M, respectively. As described in more detail below, this allows the multiplier and multiplicand to be routed from the CLEs to the multiplier tiles, and allows the product to be routed from the multiplier tiles to the CLEs.

Conceptually, FPGA 400 can be thought of as a conventional FPGA with an array of multiplier tiles located "above" the array of CLES. Adjacent multiplier tiles can be selectively coupled together to form one or more multiplier circuits. CLEs are coupled to the multiplier tiles to provide the multiplier and multiplicand bits to the appropriate multiplier tiles, and to receive the resulting product bits from the appropriate multiplier tiles. As will become apparent in view of the disclosure below, the only CLEs that must be coupled to their associated multiplier tiles are those CLEs associated with multiplier tiles located at the periphery of a multiplier circuit. For example, if an 8×8 array of multiplier tiles are coupled to form a multiplier circuit, then many of the CLEs associated with the centrally located multiplier tiles need not be coupled to their associated multiplier tiles. This advantageously allows these CLEs to be used for other purposes.

Figure 6:
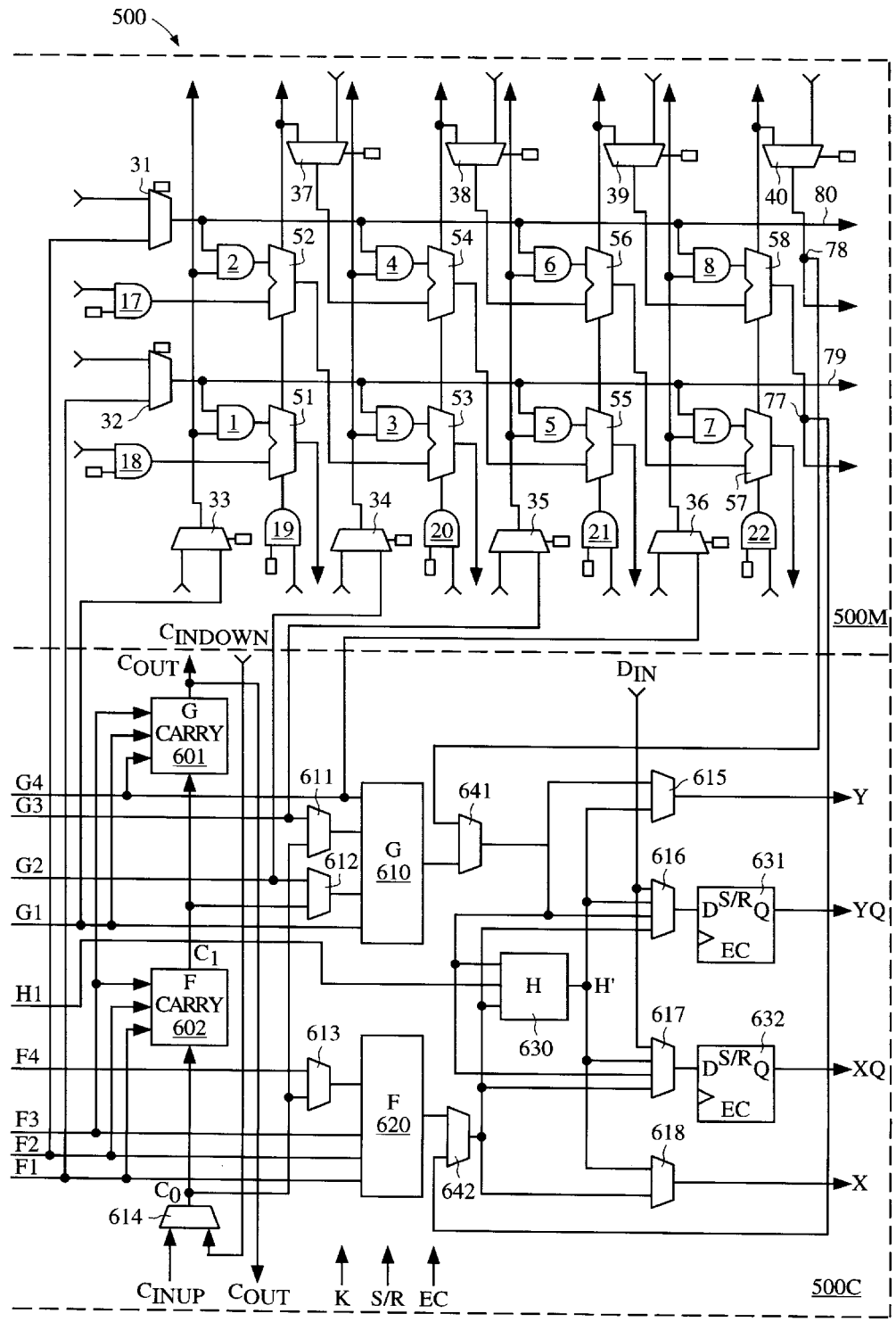
FIG. 6 is a schematic diagram of a CLB in accordance with one embodiment of the present invention.

FIG. 6 is a schematic diagram of CLB 500 in accordance with one embodiment of the present invention. As previously described, CLB 500 includes configurable logic element (CLE) 500C and multiplier tile 500M. These elements are described in more detail below.

CLE 500C includes G carry logic 601, F carry logic 602, G function generator 610, F function generator 620, H function generator 630, multiplexers 611–618, flip flops 631–632 and multiplexers 641–642. CLE 500C can be configured to receive input signals F1–F4, G1–G4, H1, K (clock), S/R (set/reset), EC (enable clock), CIN UP (carry in up) and $C_{IN\ DOWN}$ (carry in down) CLE 500C can also be configured to provide output signals X, Y, XQ, YQ and $C_{OUT}$ (carry out). All of the elements of CLE 500C are conventional elements which are found in the XC4000 family of FPGAs available from Xilinx, Inc., and described in more detail in *The Programmable Logic Data Book*, (PN0401253) (1994) pp. 2-5 to 2-102, and in *The Programmable Logic Data Book*, (PN0010303) (1996) pp. 4-5 to 4-96.

A general description of the conventional elements of CLE 500C is provided below. In general, the input and output terminals of CLE 500C are connected to the programmable interconnect resources 403 of FPGA 400. Multiplexer 614 routes either the $C_{IN\ UP}$ or the $C_{IN\ DOWN}$ signal as carry signal $C_0$. F carry logic 602 receives the F1–F3 input signals and the $C_0$ signal as routed by multiplexer 614. In response, F carry logic 602 provides carry signal $C_1$ to G carry logic 601 and to multiplexer 612. G carry logic 601 also receives the G1, G4 and F3 input signals. In response to these input signals, G carry logic 601 provides the carry output signal $C_{OUT}$.

F function generator 620 receives the F1–F3 input signals and either the F4 input signal or the $C_0$ carry signal as routed by multiplexer 613. In response, F function generator 620 generates an output signal F'. G function generator 610 receives the G1 input signal, the G4 input signal, the G2 input signal or the C1 carry signal as routed by multiplexer 612, and the G3 input signal or the $C_0$ carry signal as routed by multiplexer 611. In response, G function generator 610 generates an output signal G'. Each of function generators 610 and 620 is capable of implementing any arbitrarily defined Boolean function of its four input signals. H function generator 630 receives input signals F', G' and H1, and in response, provides an output signal H' which can be any Boolean function of these three input signals.

Multiplexers 615–618 are controlled to route the various signals out of the CLE 500C to programmable interconnect resources 403 as illustrated. Multiplexers (not shown) are controlled to route the K signal or the inverse of the K signal to the clock input terminals of flip-flops 631 and 632. Similarly, multiplexers (not shown) are controlled to route the EC signal or a default logic '1' value to flip flops 631 and 632. Set/reset signals are provided to flip flops 631 and 632 by control circuits (not shown) which operate in response to the S/R input signal.

As described in more detail below, multiplexers 641 and 642, which are non-conventional elements within CLE 500C, are configured to route either the G' and F' output signals, respectively, or two signals received from multiplier tile 500M.

The previously described multiplexers, function generators and carry logic circuits are configured by programming configuration memory cells associated with CLE 500C, in a manner known to those of ordinary skill in the art. Although the present invention is described in connection with a particular CLE circuit, it is understood that other CLE circuits can be used, and are considered to be within the scope of the present invention.

In addition to the previously described elements, CLB 400 includes multiplier tile 500M. Multiplier tile 500M includes AND gates 1–8 and 17–22, two-to-one multiplexers 31–40 and adder circuits 51–58.

Multiplexers 32 and 31 are coupled to receive the F1 and F2 input signals, respectively, from CLE 500C. Multiplexers 32 and 31 can be configured to pass the F1 and F2 input signals, respectively. The second input terminals of multiplexers 31 and 32 are coupled to corresponding output terminals 80 and 79 of the left adjacent multiplier tile in CLB 497 (See, FIG. 4). Multiplexers 31 and 32 are controlled by configuration data values that are programmed in attached configuration memory cells. The output terminal of multiplexer 31 is coupled to input terminals of AND gates 2, 4, 6 and 8, and to output terminal 80. The output terminal of multiplexer 32 is coupled to input terminals of AND gates 1, 3, 5 and 7, and to output terminal 79.

AND gates 17 and 18 each have a first input terminal coupled to the left adjacent multiplier tile in CLB 497 (FIG. 4), and a second input terminal coupled to a configuration memory cell. The output terminals of AND gates 17 and 18 are coupled to input terminals of adder circuits 51 and 52, respectively. Multiplexers 33–36 are coupled to receive the G1–G4 input signals, respectively, from CLE 500C. Multiplexers 33–36 can be configured to pass the G1–G4 signals, respectively. The other input terminals of multiplexers 33–36 are coupled to corresponding output terminals of a lower adjacent multiplier tile in CLB 499 (FIG. 4).

Each of multiplexers 33–36 is controlled to pass one of the two applied input signals in response to a configuration data value programmed in an associated configuration memory cell. The output terminal of multiplexer 33 is coupled to input terminals of AND gates 1–2. The output terminal of multiplexer 34 is coupled to input terminals of AND gates 3–4. The output terminal of multiplexer 35 is coupled to input terminals of AND gates 5–6. The output terminal of multiplexer 36 is coupled to input terminals of AND gates 7–8.

Each of AND gates 19–22 has a first input terminal coupled to the lower adjacent multiplier tile in CLB 499 (FIG. 4), and a second input terminal coupled to a configuration memory cell. The output terminals of AND gates 19, 20, 21 and 22 are coupled to carry input terminals of adder circuits 52, 54, 56 and 58, respectively.

The output terminals of AND gates 1–8 are coupled to input terminals of adder circuits 51–58, respectively. The output terminals of adder circuits 51, 53, 55 and 57 are routed to the lower adjacent multiplier tile in CLB 499 (FIG. 4). The output terminals of adder circuits 52, 54 and 56 are routed to input terminals of adder circuits 53, 55 and 57, respectively. The output terminal of adder circuit 58 is coupled to an output terminal 77 and to an input terminal of multiplexer 642 in CLE 500C. Output terminal 77 is coupled to the right adjacent multiplier tile in CLB 502 (FIG. 4).

The carry output terminals of adder circuits 51, 53, 55 and 57 are connected to the carry input terminals of adder circuits 52, 54, 56 and 58, respectively. The carry output terminals of adder circuits 52, 54, 56 and 58 are coupled to input terminals of multiplexers 37, 38, 39 and 40, respectively, and to the upper adjacent multiplier tile in CLB 501 (FIG. 4). The other input terminals of multiplexers 37–40 are coupled to the upper adjacent multiplier tile in CLB 501. The output terminals of multiplexers 37, 38 and 39 are coupled to input terminals of adder circuits 54, 56 and 58, respectively. The output terminal of multiplexer 40 is coupled to output terminal 78 and to an input terminal of multiplexer 641 in CLE 500C. The output terminal 78 is coupled to the right adjacent multiplier tile in CLB 502 (FIG. 4).

In addition to their normal selection functions, multiplexers 31–40 are programmable to drive an arbitrary static signal onto their respective output terminals when multiplier tile 500M is not used. This arbitrary static signal reduces or eliminates unnecessary power dissipation in multiplier tile 500M when multiplier tile 500M is not used. The arbitrary static signal can be, for example, the ground supply voltage. This static signal is not shown in the Figures for purposes of clarity.

Figure 7:
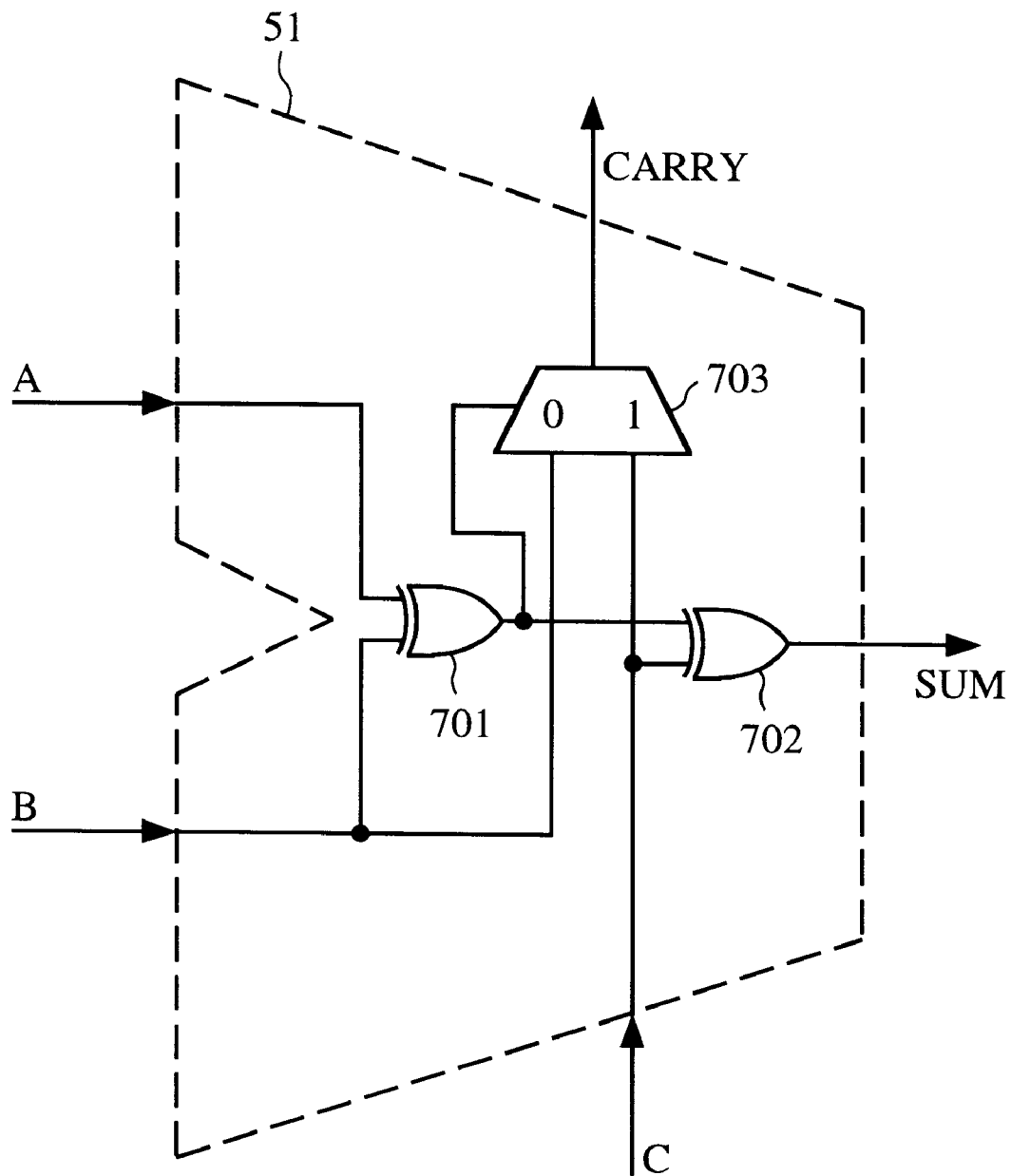
FIG. 7 is a circuit diagram of an adder circuit used in various embodiments of the present invention.

FIG. 7 is a circuit diagram of adder circuit 51. Adder circuits 52–58 are identical to adder circuit 51. Adder circuit 51 includes exclusive OR gates 701–702 and multiplexer 703, which are coupled as illustrated. Adder circuit 51 generates a SUM output signal and a CARRY output signal in response to the three input signals A, B and C. Exclusive OR gates 701–702 and multiplexer 703 are coupled to generate the SUM and CARRY signals in accordance with Table 1.

Multiplier tile 500M provides a structure that facilitates a 2×4 bit multiplication operation. In the XC4000 family of FPGAs, arithmetic data paths are typically implemented with two bits per CLB row. To match this bit pitch for multiplicand input signals and product output signals, multiplier tile 500M supports two bits per row. As a compromise between density and granularity, multiplier tile 500M supports four bits (i.e., multiplier input signals) per CLB column. It is understood that in other embodiments, multiplier tile 500M can have other dimensions.

In general, multiplier and multiplicand bits are provided to multiplier tile 500M by programming multiplexers 31–36. The programmed multiplexers provide closed electrical connections between CLE 500C and multiplier tile 500M. As a result, the F1–F2 and G1–G4 input signals provided to CLE 500C are routed through multiplexers 31–36, respectively, of multiplier tile 500M. The F1–F2 input signals are selected to correspond with a 2-bit multiplicand value, and the G1–G4 input signals are selected to correspond with a 4-bit multiplier value.

Alternatively, a 2-bit multiplicand value can be routed into multiplier tile 500M from a left adjacent multiplier tile in CLB 497. Similarly, a 4-bit multiplier value can be routed into multiplier tile 500M from a lower adjacent multiplier tile in CLB 499.

In general, product bits are routed from multiplier tile 500M to CLE 500C by programming multiplexers 40 and 58 to provide closed electrical connections between multiplier tile 500M and CLE 500C. As a result, two product bits are routed from multiplexers 40 and 58 to multiplexers 641 and 642, respectively, of CLE 500C. These product bits can be routed out of CLE 500C to programmable interconnect resources 403 by configuring multiplexers 615–618. For example, multiplexer 615 can be programmed to route one product bit as the Y output signal, and multiplexer 618 can be configured to route the other product bit as the X output signal. These product bits can alternatively be routed through multiplexers 616–617 and flip-flops 631–632 as the output signals YQ and XQ.

Alternatively, these product bits can be routed from multiplier tile 500M to a right adjacent multiplier tile in CLB 502 on output terminals 77 and 78.

Figure 8:
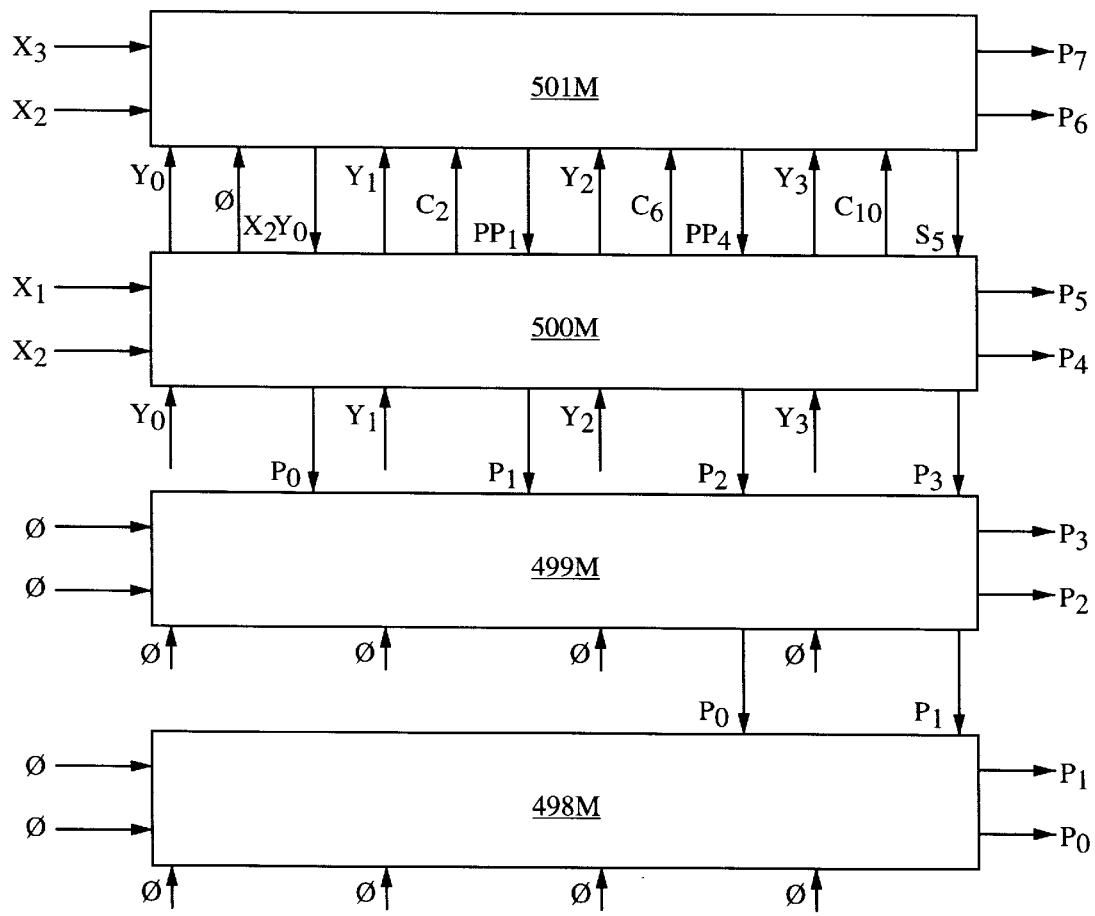
FIG. 8 is a block diagram illustrating multiplier tiles coupled to create a 4×4 bit unsigned carry-propagate multiplier in accordance with one embodiment of the present invention.
Figures 9, 9A:
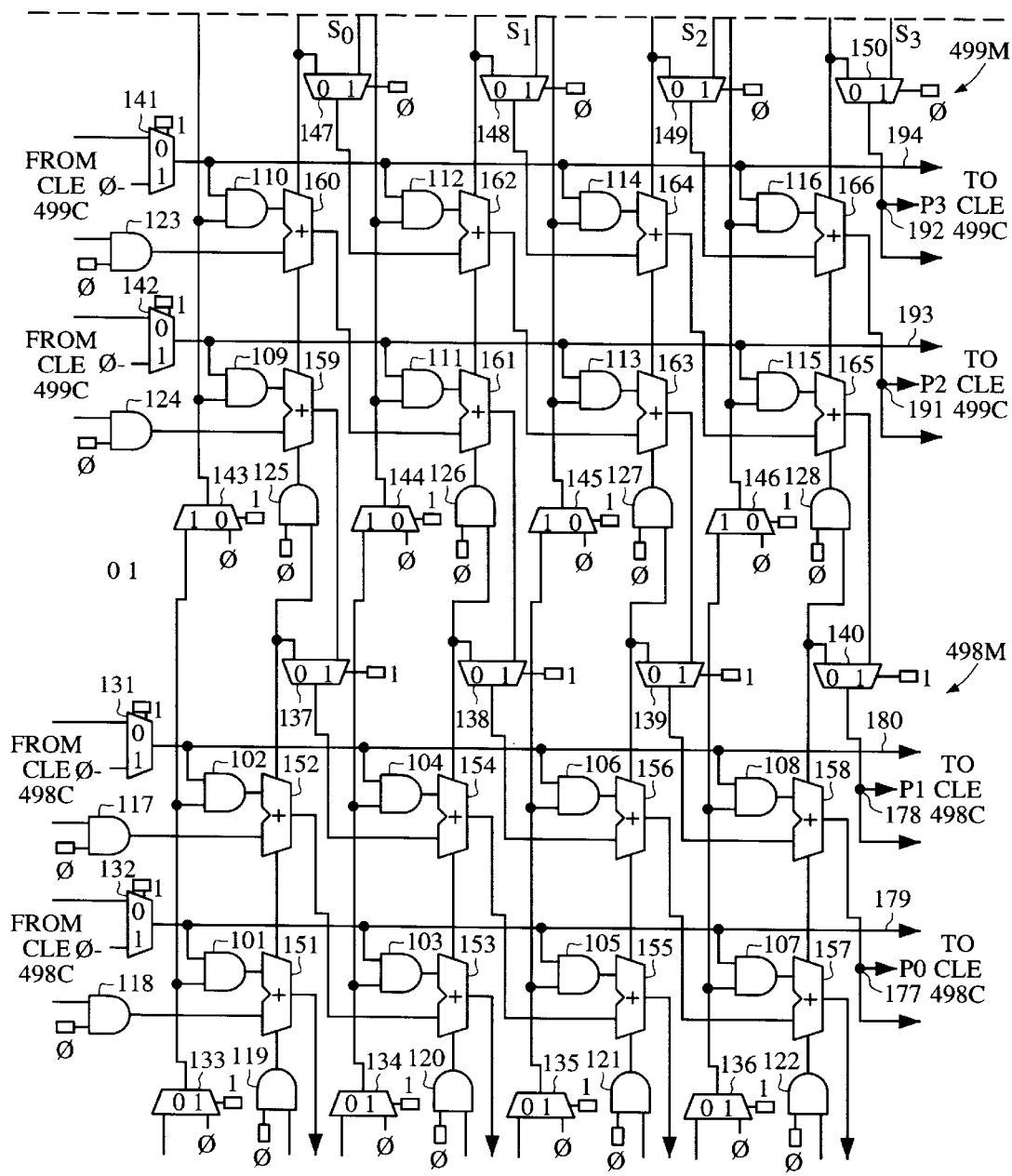
FIG. 9, which includes
FIGS. 9A and 9B, is a circuit diagram illustrating the multiplier tiles of FIG. 8.

The operation of multiplier tile 500M will now be described in connection with a specific example, which is illustrated in FIGS. 8 and 9. In this example, a 4×4 bit multiplication is performed using an unsigned 4-bit multiplier Y3–Y0 and an unsigned 4-bit multiplicand X3–X0. Because this operation is similar to the 4×4 bit multiplication operation previously described in connection with FIG. 1B, similar reference numbers are used in FIGS. 1B, 8 and 9.

FIG. 8 is a block diagram illustrating multiplier tiles 498M–501M, which are coupled to create the 4×4 bit multiplier. Multiplier tile 500M receives multiplicand bits X1–X0 from its associated CLE 500C. Similarly, multiplier tile 501M receives multiplicand bits X3–X2 from its associated CLE 501C. Multiplier bits Y3–Y0 are applied to multiplier tile 500M through its associated CLE 500C. These multiplier bits Y3–Y0 are propagate up through multiplier tile 501M. Multiplier tiles 500M and 501M provide product bits P7–PD in response to multiplicand bits X3–X0 and multiplier bits Y3–YD. Note that multiplier tile 501M receives carry bits 0, C2, C6 and C10 from multiplier tile 500M, and provides sum signals X2Y0, PP1, PP4 and P5 (as defined in FIG. 1B) to multiplier tile 500M in accordance with the multiplication operation. Product bits P3 and P2 are routed in from the top and out through the right side of multiplier tile 499M. Product bits P1 and P0 are routed through multiplier tile 499M to multiplier tile 498M, and then out through the right side of multiplier tile 498M.

Product bits P7–P6 and P5–P4 are routed from multiplier tiles 501M and 500M, respectively, to CLEs 501C and 500C, respectively. Because each CLB can only output two product bits, two additional multiplier tiles 499M and 498M are used to output the least significant product bits P3–P0. More specifically, product bits P3–P2 are routed from multiplier tile 499M into its associated CLE 499C. Similarly, product bits P1–P0 are routed from multiplier tile 498M into its associated CLE 498. As described in more detail below, product bits P3–P0 are shifted out of multiplier tiles 499M and 498M by applying logic "0" values to the multiplicand and multiplier input terminals of multiplier tiles 499M and 498M.

Figure 9B:
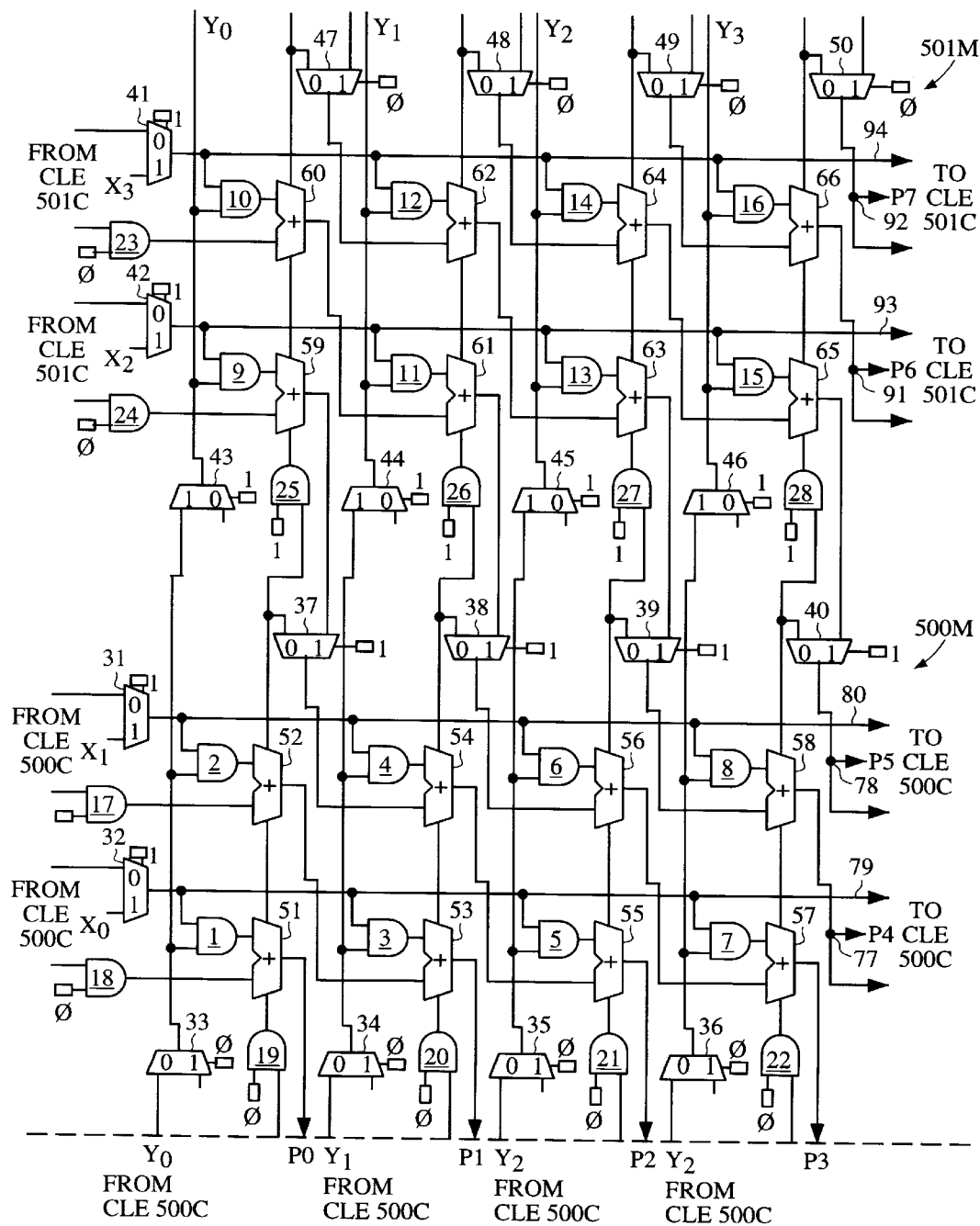

FIG. 9, which includes FIGS. 9A and 9B, is a circuit diagram that illustrates the multiplier tiles 498M–501M of FIG. 8 in more detail. Multiplier tile 500M was described above in connection with FIG. 6. Multiplier tiles 498M, 499M and 501M are identical to the previously described multiplier tile 500M. However, multiplier tiles 498M, 499M and 501M are labeled with different reference numbers to help clarify the discussion below. Thus, multiplier tile 501M includes AND gates 9–16 and 23–28, multiplexers 41–50, adder circuits 59–66 and output terminals 91–94. Multiplier tile 499M includes AND gates 109–116 and 123–128, multiplexers 141–150, adder circuits 159–166 and output terminals 191–194. Multiplier tile 498M includes AND gates 101–108 and 117–122, multiplexers 131–140, adder circuits 151–158 and output terminals 177–180.

Within multiplier tiles 501M, 500M, 499M and 498M, multiplexers 31–36, 41–46, 131–136 and 141–146 are programmed to provide electrical connections to the associated CLEs 501C, 500C, 499C and 498C, respectively. Multiplicand bits X3–X2 are routed from CLE 501C through multiplexers 41–42, respectively. Multiplicand bits X1–X0 are routed from CLE 500C through multiplexers 31–32, respectively. Logic "0" bits are routed from CLEs 499C and 498C through multiplexers 141–142 and 131–132.

Within multiplier tile 500M, multiplexers 33–36 are configured to provide electrical connections to the associated CLE 500C. The four multiplier bits Y3–Y0 are routed from CLE 500C, through multiplexers 33–36, respectively.

Within multiplier tiles 498M and 499M, multiplexers 133–136 and 143–146 are configured to provide electrical connections to their associated CLEs 498C and 499C, respectively. Four logic "0" bits are routed from each of CLEs 498C and 499C, through multiplexers 133–136 and 143–146, respectively.

In the foregoing manner, the four multiplier bits Y3–Y0 are provided to the multiplier circuit through a single CLE (i.e., CLE 500C), and subsequently propagate vertically within the adjacent multiplier tiles.

The configuration memory cells attached to AND gates 17–24 and 117–128 are programmed to provide logic "0" values, thereby initializing the sum and carry input signals. The configuration memory cells attached to AND gates 25–28 are programmed to provide logic "1" values, thereby enabling these AND gates to pass the carry signals received from adder circuits 52, 54, 56 and 58. Multiplexers 37–40 are configured to pass the output signals received from adder circuits 59, 61, 63 and 65, respectively. Multiplexers 47–50 are configured to pass the carry output signals received from adder circuits 60, 62, 64 and 66.

Figure 2:
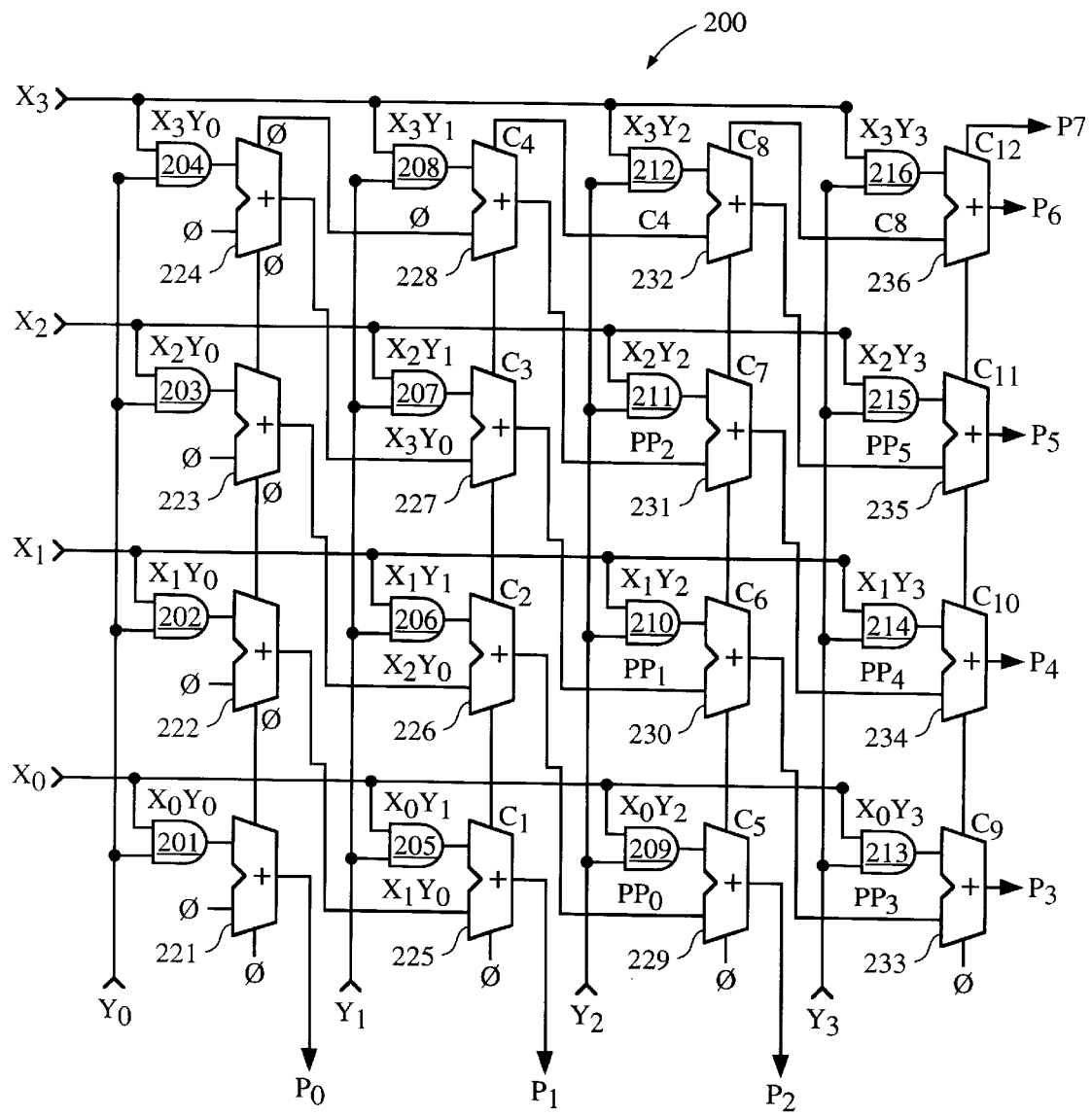
FIG. 2 is a circuit diagram of a conventional 4×4 bit multiplier circuit for implementing the multiplication operation illustrated in FIGS. 1A and 1B.
Figures 3, 3A:
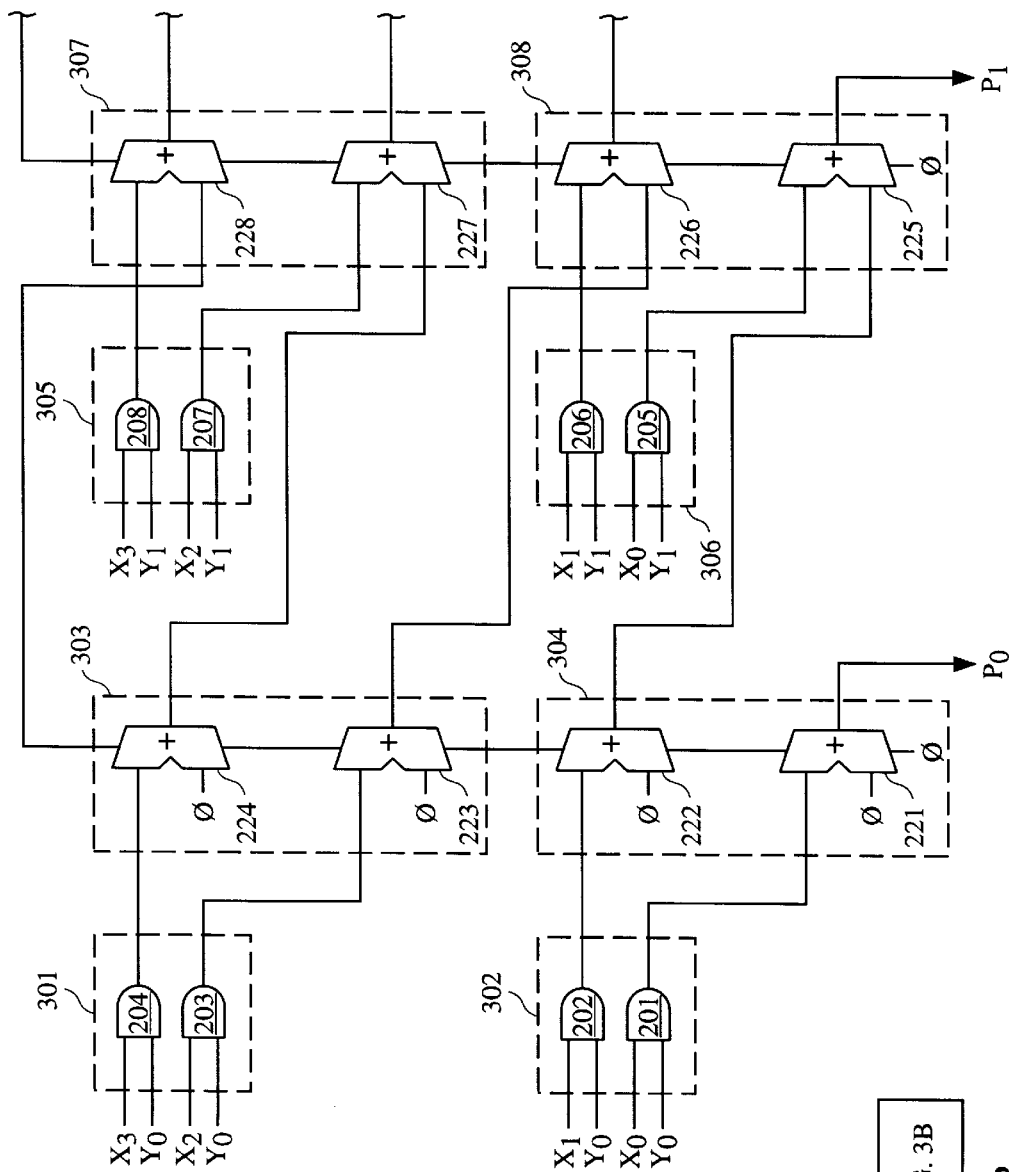
FIG. 3, which includes
FIGS. 3A and 3B, is a circuit diagram illustrating the conventional implementation of the multiplier circuit of FIG. 2 in an FPGA.
Figure 3B:
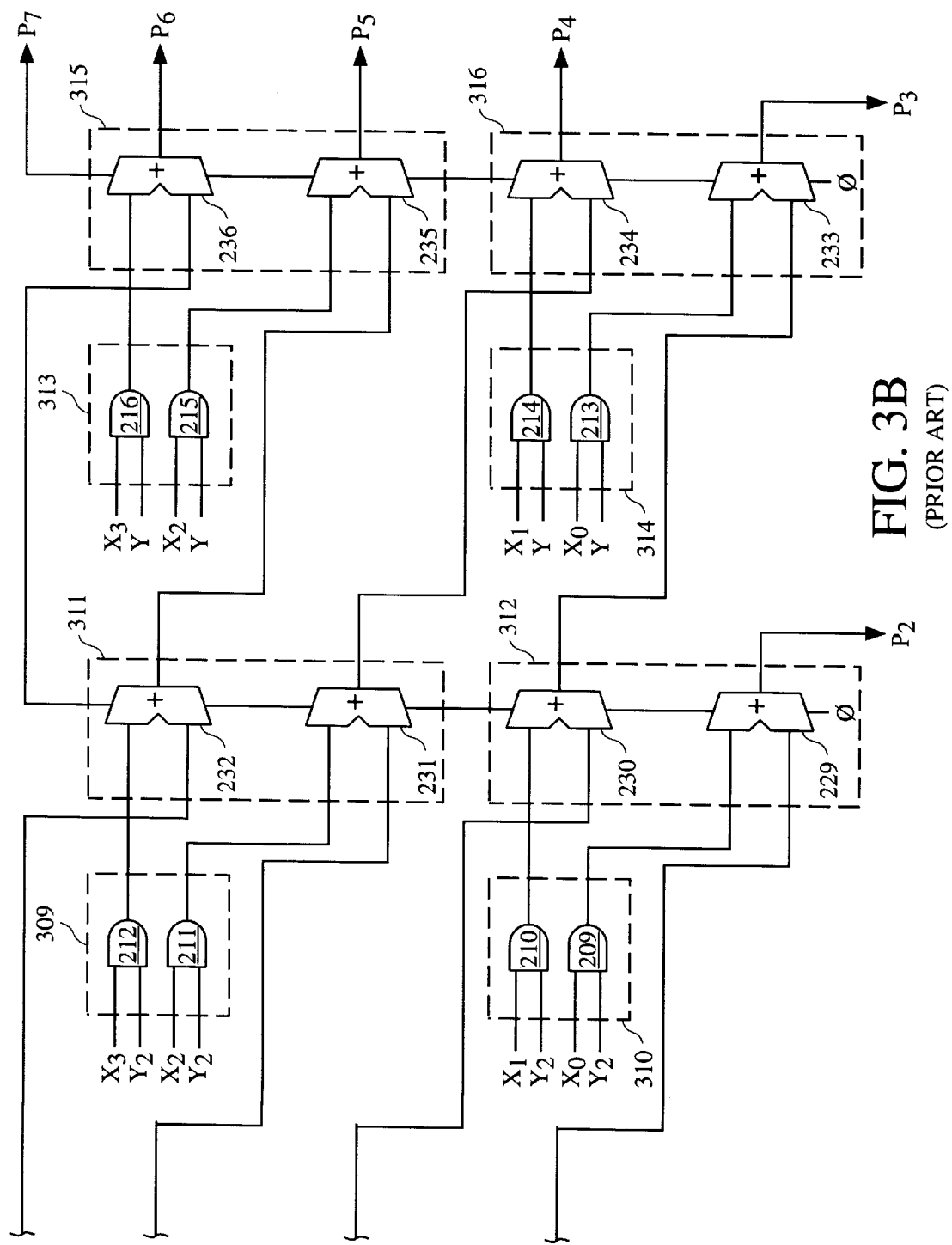

When configured in the foregoing manner, multiplier tiles 501M and 500M form a multiplier circuit that operates in the same manner as multiplier circuit 200 (FIG. 2). Consequently, multiplier tiles 501M and 500M provide product bits P7–P0 as illustrated.

Product bits P7–P6 are routed to output terminals 91 and 92, respectively, and are output through the associated CLE 501C. Similarly, product bits P5–P4 are routed to output terminals 77 and 78, respectively, and are output through the associated CLE 500C.

Product bits P3–P0 are routed from multiplier tile 500M down into multiplier tile 499M. Multiplexers 147–150 are configured to pass these product bits P3–P0. After passing through multiplexer 150, product bit P3 is routed to output terminal 192, and is output through the associated CLE 499C. After passing through multiplexer 149, product bit P2 is routed to an input terminal of adder 166. Because each of AND gates 109–116 receives a logic "0" multiplicand bit, each of AND gates 109–116 provides a logic "0" signal to its associated adder circuit. Note also that the carry inputs are logic "0". Thus, AND gate 116 provides a logic "0" signal to the other input terminal of adder 166. Consequently, adder circuit 166 provides product bit P2 as an output signal. This product bit P2 is routed to output terminal 191, and is output through the associated CLE 499C.

The logic "0" signals provided by AND gates 114 and 115 allow product bit P1 to propagate through adder circuits 164 and 165 to multiplexer 140 of multiplier tile 498M. Similarly, the logic "0" signals provided by AND gates 112 and 113 allow product bit P0 to propagate through adder circuits 162 and 163 to multiplexer 139 of multiplier tile 498M.

Multiplexers 139 and 140 are configured to pass product bits P0 and P1, respectively. Product bit P1 is routed from multiplexer 140 to output terminal 178, and is output through the associated CLE 498C. Product bit P0 is routed from multiplexer 139 to an input terminal of adder circuit 158. Each of AND gates 101–108 provides a logic "0" output signal in response to the applied logic "0" multiplicand bits provided by multiplexers 131 and 132. As a result, AND gate 108 provides a logic "0" signal to the other input terminal of adder circuit 158. As a result, adder circuit 158 provides the product bit P0 as an output signal on output terminal 177. Product bit P0 is passed to output terminal 178, and is output through the associated CLE 498C.

In the foregoing manner, product bits P7–P0 are routed out through the underlying CLEs 498C–501C.

Figure 10:
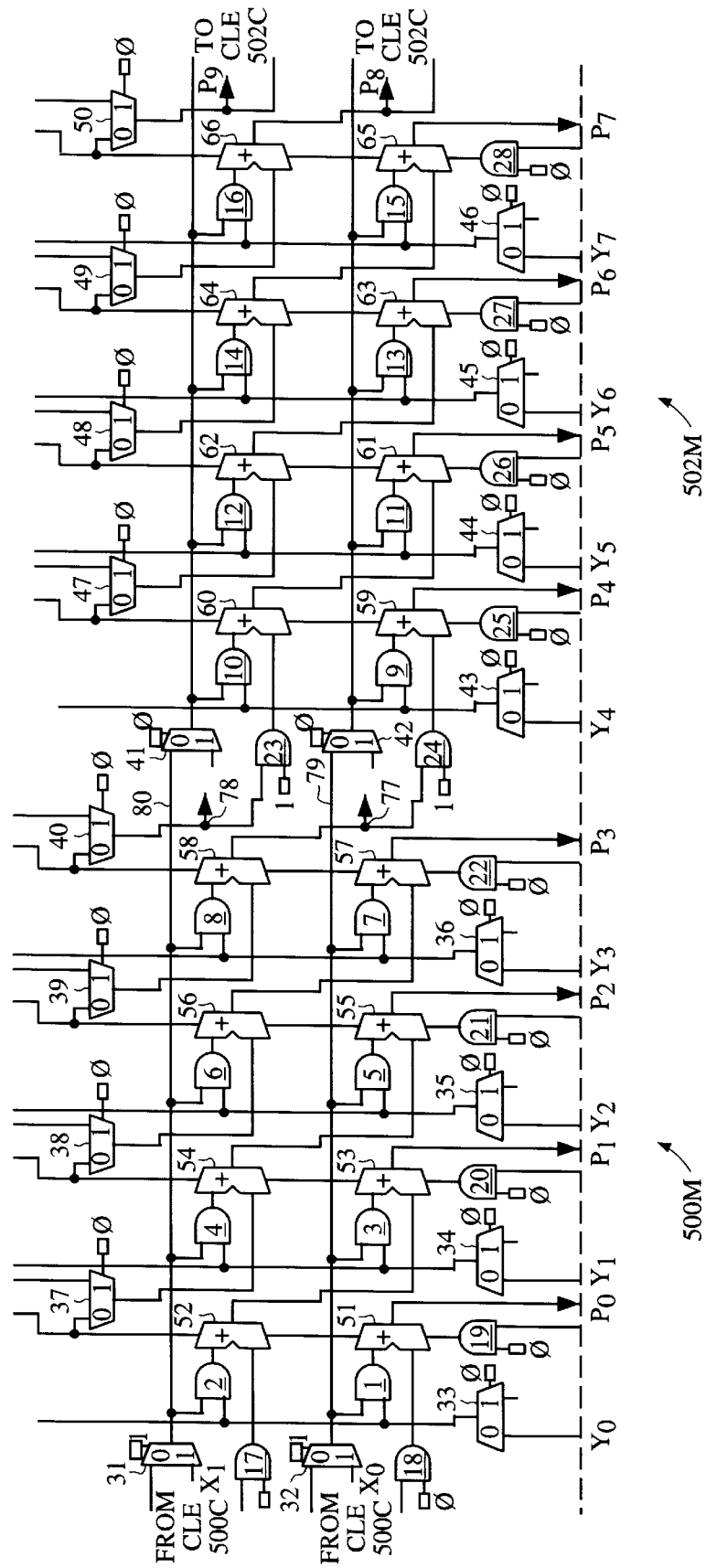
FIG. 10 is a circuit diagram illustrating the coupling of two multiplier tiles located in adjacent columns.

Although the example listed above only uses one column of multiplier tiles, any number of columns of multiplier tiles can be used to create a multiplier circuit. FIG. 10 illustrates the coupling of multiplier tiles 500M and 502M, which are located in adjacent columns (FIG. 4). Because multiplier tile 502M is identical to multiplier tile 501M (FIG. 8B), similar elements in multiplier tiles 501M and 502M are labeled with similar reference numbers. Multiplier tiles 500M and 502M are coupled to form a 2×8 bit multiplier circuit which multiplies 2-bit multiplicand X1–X0 and 8-bit multiplier Y7–Y0. Note that multiplicand bits X1 and X0 propagate horizontally to multiplexers 41 and 42 of multiplier tile 502M. Multiplexers 41 and 42 are configured to pass these multiplicand bits X1 and X0. Note also that output terminals 78 and 77 are connected to AND gates 23 and 24, respectively. AND gates 23 and 24 are configured to pass the signals received on output terminals 78 and 77 (by programming the other terminal of AND gates 23 and 24 to receive logic "1" values). The multiplier tiles required to bring out the least significant product bits P7–P0 are not shown in FIG. 10 for purposes of clarity.

Figure 11:
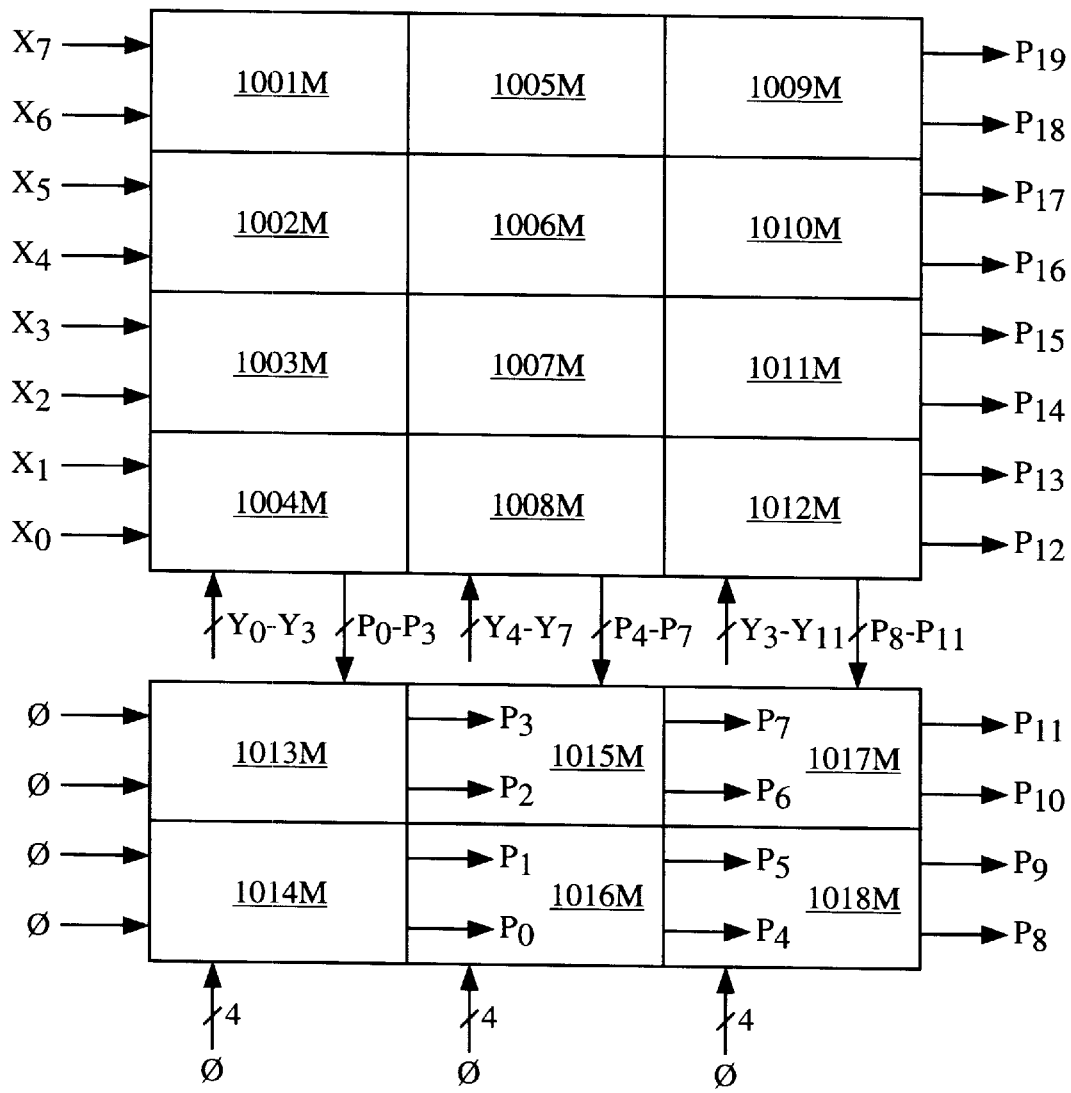
FIG. 11 is a block diagram illustrating a multiplier circuit which multiplies an 8-bit multiplicand and a 12-bit multiplier using eighteen multiplier tiles.

It is important to note that only two additional rows of multiplier tiles are required to route the least significant product bits, regardless of the size of the multiplier. FIG. 11 is a block diagram illustrating an 8×12 bit multiplier circuit which multiplies multiplicand X7–X0 and multiplier Y11–Y0 using multiplier tiles 1001M–1018M. Multiplier tiles 1001M–1012M generate product bits P19–P0. Product bits P19–P12 are routed from multiplier tiles 1009M–1012M out to the CLEs (not shown) associated with multiplier tiles 1009M–1012M. Product bits P11–P8 are routed from multiplier tile 1012M to lower adjacent multiplier tile 1017M. Product bits P11–P10 and P9–P8 are then routed through multiplier tiles 1017M–1018M to the associated CLEs (not shown) in the manner previously described in connection with FIG. 9.

In a similar manner, product bits P7–P4 are routed from multiplier tile 1008M out through the CLEs associated with multiplier tiles 1015M and 1016M. In addition, product bits P3–P0 are routed form multiplier tile 1004M out through the CLEs associated with multiplier tiles 1013M–1014M. Thus, only two additional rows of multiplier tiles are required to bring out the least significant product bits P11–P0.

It is also important to note that not all of the CLEs associated with multiplier tiles 1001M–1018M are required to form the resulting multiplier circuit. More specifically, the CLEs associated with multiplier tiles 1005M–1007M are not required to create the described multiplier circuit. This is because these CLEs do not have any required connections to their associated multiplier tiles 1005M–1007M. As a result, these CLEs can be used to implement other logic functions in the FPGA. The CLE associated with multiplier tile 1008M is also not required if the multiplier Y input is provided through multiplier tiles 1013M, 1015M, 1017M or 1014M, 1016M, 1018M. In that case, the Y operand would be propagated to tiles 1004M, 1008, and 1012M in the same way that the Y operand is propagated through tiles 1001M–1012M, but would result in some additional delay. Additionally, the CLEs associated with multiplier tiles 1013M–1018M are not used if product bits P0–P11 are not required.

The previous examples described multiplier circuits that performed unsigned multiplication (i.e., the multiplication of two unsigned numbers). As described in more detail below, the multiplier tiles can be modified in other embodiments, thereby enabling 2's complement signed multiplication (i.e., the multiplication of two signed numbers) and 2's complement signed/unsigned multiplication (i.e., the multiplication of a signed number with an unsigned number).

Figure 12:
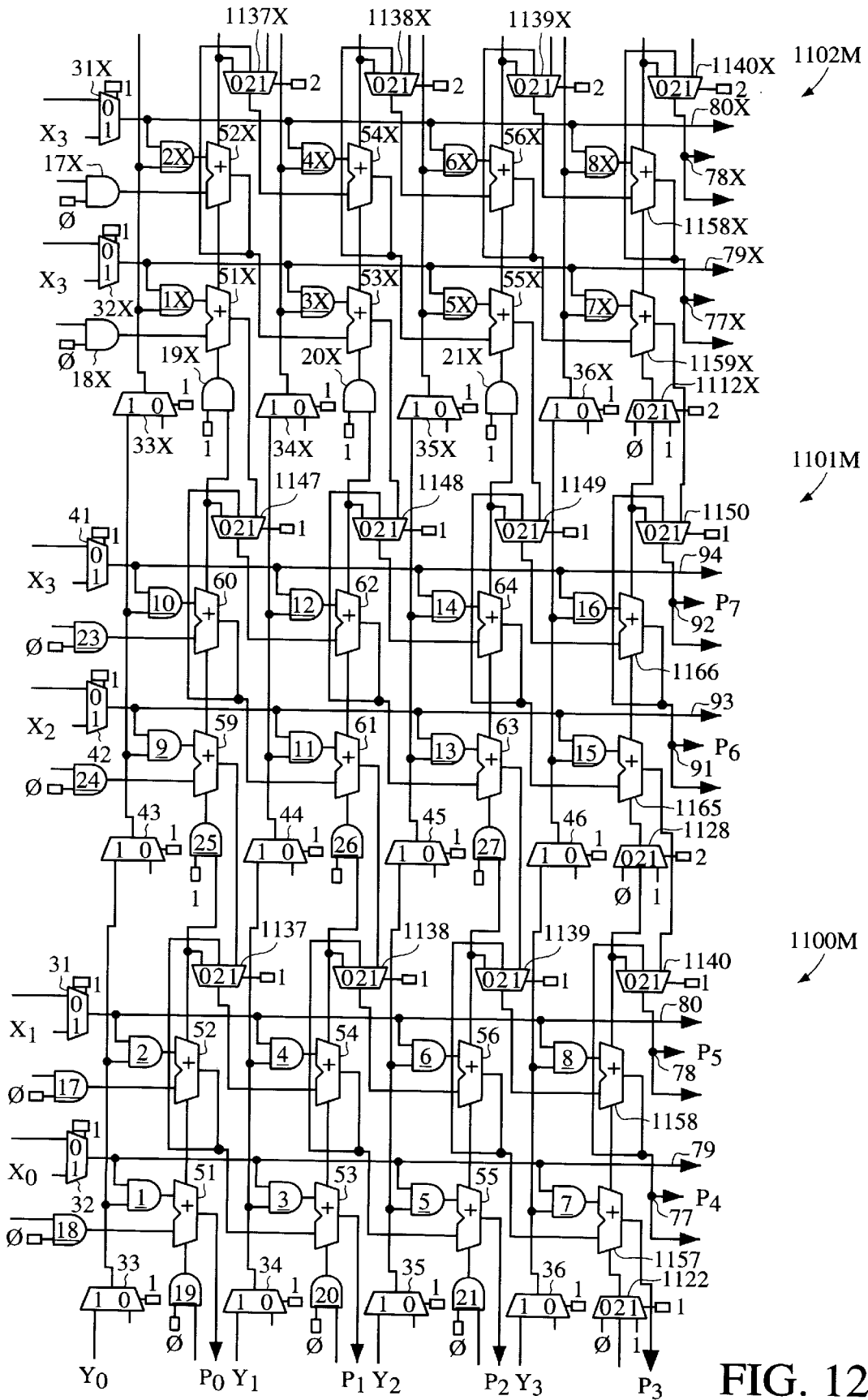
FIG. 12 is a circuit diagram of three identical multiplier tiles in accordance with an embodiment which supports signed carry-propagate multiplication.

FIG. 12 is a circuit diagram of three identical multiplier tiles 1100M, 1100M and 1102M in accordance with another embodiment of the present invention. These multiplier tiles are coupled to corresponding CLEs (not shown) in the same manner previously described in connection with FIGS. 5 and 6. Because multiplier tiles 1100M and 1101M are similar to multiplier tiles 500M and 501M (FIG. 9B), similar elements in FIGS. 9B and 12 are labeled with similar reference numbers. Multiplier tile 1102M, which is an extra multiplier tile used to handle the sign extension of a signed multiplication operation, is labeled with reference numbers that are similar to the reference numbers of multiplier tile 1100M, but followed by the letter "X" (for sign extension).

Multiplier tiles 1100M and 1101M replace the adder circuits 57–58 and 65–66 of multiplier tiles 500M and 501M with adder/subtractor circuits 1157–1158 and 1165–1166. Multiplier tile 1102M similarly includes adder/subtractor circuits 1157X and 1158X. Multiplier tiles 1100M and 1101M further replace AND gates 22 and 28 of multiplier tiles 500M and 501M with three-to-one multiplexers 1122 and 1128. Multiplier tile 1102M includes a similar three-to-one multiplexer 1112X. As described in more detail below, adder/subtractor circuits 1157–1158, 1165–1166 and 1157X–1158X and multiplexers 1122, 1128 and 1122X allow the multiplier Y3–Y0 to be an unsigned or signed (2's complement) number.

Multiplier tiles 1100M and 1101M further replace multiplexers 37–40 and 47–50 of multiplier tiles 500M and 501M with three-to-one multiplexers 1137–1140 and 1147–1150. Two input terminals of each of the three-to-one multiplexers 1137–1140 and 1147–1150 are connected in the same manner as the input terminals of multiplexers 37–40 and 47–50. The third input terminals of three-to-one multiplexers 1137–1140 are connected to the output terminals of adder circuits 52, 54, 56, and adder/subtractor circuit 1158, respectively. Similarly, the third input terminals of three-to-one multiplexers 1147–1150 are connected to the output terminals of adder circuits 60, 62, 64 and adder/subtractor circuit 1166, respectively. Multiplier tile 1102M includes three-to-one multiplexers 1137X–1140X, which are coupled in a similar manner. As described in more detail below, multiplexers 1137–1140, 1147–1150 and 1137X–1140X enable the multiplicand X to be a signed (2's complement) number.

Figure 13:
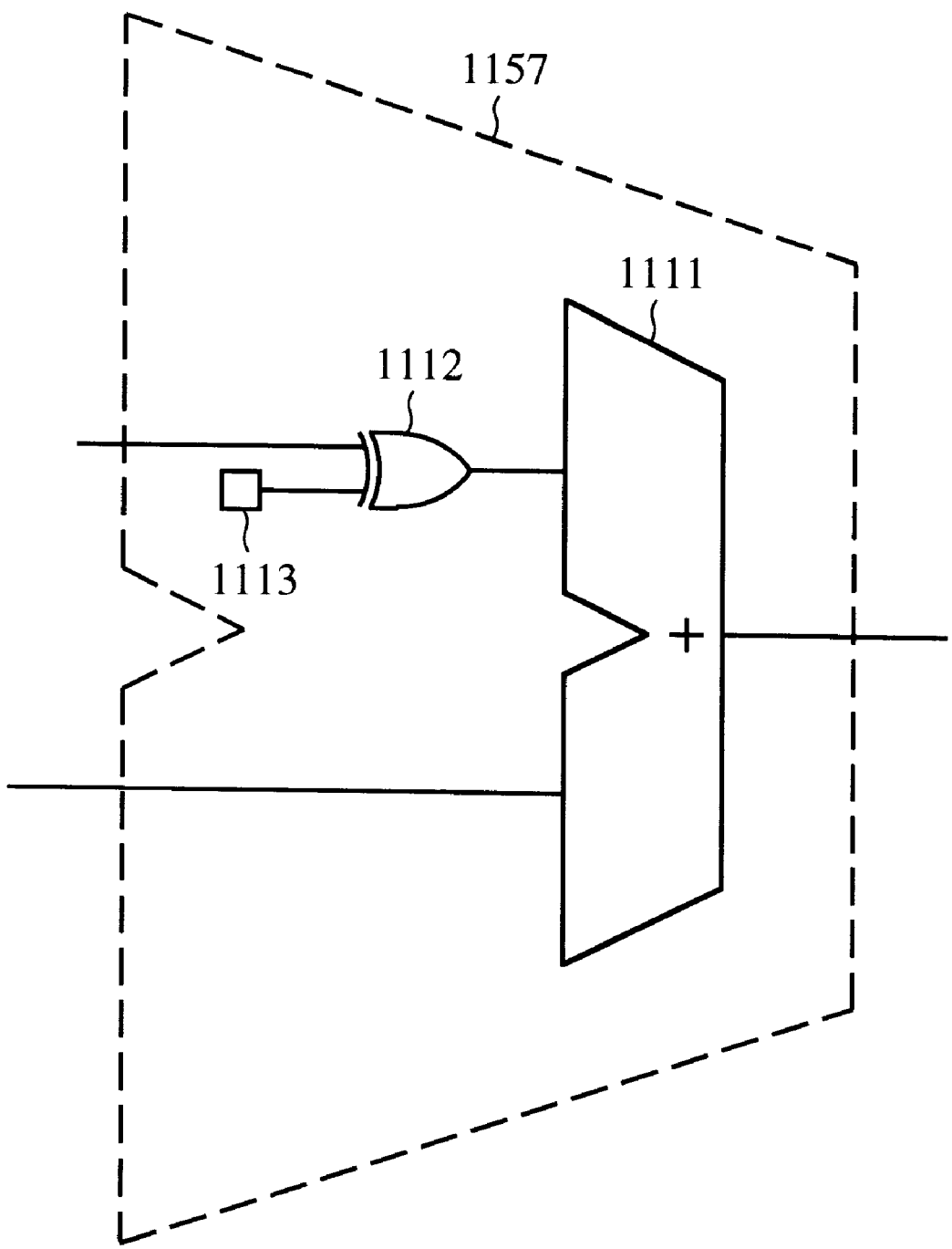
FIG. 13 is a circuit diagram of an adder/subtractor circuit used in various embodiments of the present invention.

FIG. 13 is a circuit diagram of adder/subtractor circuit 1157. Adder/subtractor circuits 1158, 1165–1166 and 1157X–1158X are identical to adder/subtractor circuit 1157. As illustrated in FIG. 13, adder/subtractor circuit 1157 includes an adder circuit 1111 (See, FIG. 7) having an input terminal coupled to an exclusive OR gate 1112. One input terminal of the exclusive OR gate 1112 is coupled to configuration memory cell 1113, and the other input terminal of exclusive OR gate 1112 is coupled to receive a first input signal. When adder/subtractor circuit 1157 is to operate in an addition, configuration memory cell 1113 is programmed to provide a logic "0" value. This logic "0" value causes the first input signal to be routed to adder circuit 1111. Conversely, when adder/subtractor circuit 1157 is to operate in a subtraction, configuration memory cell 1113 is programmed to provide a logic "1" value. This logic "1" value causes the inverse of the first input signal to be provided to adder circuit 1111. Because the subtraction mode comprises adding the inverse of a value, the definition of the carry in and carry out signals remain unchanged.

It is noted that multiplier tiles 1100M–1102M (plus one additional identical multiplier tile) can be configured in the same manner as the previously described multiplier tiles 498M–501M (See, FIG. 9). Thus, multiplier tiles 1100M–1102M (and the additional identical multiplier tile) can be configured to perform unsigned multiplication in the same manner previously described for multiplier tiles 498M–501M.

In addition, multiplier tiles 1100M–1102M can be configured to perform signed multiplication. As illustrated in FIG. 12, multiplier tiles 1100M–1102M are configured to multiply a 4-bit signed multiplicand X3–X0 and a 4-bit signed multiplier Y3–Y0. The 4-bit signed multiplier Y3–Y0 is routed into multiplexers 33–36 of multiplier tile 1100M from the CLE (not shown) associated with multiplier tile 1100M in the same manner as previously described in connection with FIG. 9. The least significant product bits P3–P0 are routed out through two lower adjacent multiplier tiles (not shown) in the manner previously described in connection with FIG. 9.

Multiplexers 43–46 and 33x–36X are programmed to propagate the multiplier bits Y3–Y0 through multiplier tiles 1100M–1102M. The carry input signals provided to adder circuits 51, 53 and 55 are initialized to have logic "0" 1 values by programming the configuration memory cells associated with AND gates 19–21 to provide logic "0" values. Three-to-one multiplexer 1122 is programmed to route a logic "1" value to the carry input terminal of adder/subtractor circuit 1157.

AND gates 25–27 and 19X–21X are programmed to receive logic "1" values from their associated configuration memory cells, thereby causing these AND gates to pass carry signals through multiplier tiles 1100M–1102M. Similarly, three-to-one multiplexers 1128 and 1112X are configured to pass carry signals through multiplier tiles 1100M–1102M. Adder/subtractor circuits 1157–1158, 1165–1166 and 1157X–1158X are all configured as subtractor circuits in the manner previously described in connection with FIG. 13.

Multiplexers 1137–1140 are configured to pass the output signals received from adder circuits 59, 61, 63 and adder/subtractor circuit 1165, respectively. Similarly, multiplexers 1147–1150 are configured to pass the output signals received from adder circuits 51X, 53X, 55X and adder/subtractor circuit 1159X, respectively. Multiplexers 1137X and 1138X are configured to route the sum output signals provided by adder circuits 52X and 54X to input terminals of adder circuits 54X and 56X, respectively. Multiplexer 1139X is configured to route the sum output signal provided by adder circuit 56X to an input terminal of adder/subtractor circuit 1158X. Finally, multiplexer 1140X is configured to route the sum output signal provided by adder/subtractor circuit 1158X to output terminal 78X.

Multiplicand bits X3–X0 are routed from the associated CLEs (not shown) through programmed multiplexers 31–32, 41–42 and 31X–32X as illustrated. Note that multiplier tile 1102M receives the X3 multiplicand bit through multiplexers 31X and 32X. AND gates 17–18, 23–24 and 17X–18X are configured to receive logic "0" values from their associated configuration memory cells, thereby initializing the second input terminals of adder circuits 51–52, 59–60 and 51X–52X. Output terminals 92, 91, 78 and 77 provide product bits P7–P4 to the CLEs associated with multiplier tiles 1000M and 1101M. Output terminals 77X–78X can also provide sign extension bits to the CLE associated with multiplier tile 1102M.

Once configured as described above, multiplier tiles 1100M–1102M multiply signed multiplicand X3–X0 and signed multiplier Y3–Y0. The product is provided in the form of a signed product P7–P0.

In the above-described signed multiplier circuit, multiplier tile 1102M is required because multiplicand X3–X0 is a signed number. Multiplier tile 1102M provides the sign extension operations which are required because of the signed format of multiplicand X3–X0 and the partial products derived from it. Those skilled in the art understand the use of sign extensions in 2's complement arithmetic operations.

Adder/subtractor circuits 1157–1158, 1165–1166 and 1157X–1158X must be programmed to operate as subtractor circuits, and multiplexer 1122 must be programmed to provide a logic "1" value because multiplier Y3–Y0 is a signed number. The subtractor circuits invert the product term created in response to the most significant multiplier bit Y3 (i.e., the sign bit of multiplier Y). The logic "1" value provided by multiplexer 1122 is added to this inverted product term. This "invert and add one" operation causes the product of Y3 and X to be subtracted. This is necessary because Y3 and hence the partial product is negatively weighted, as understood by those skilled in the art of 2's complement arithmetic.

In one variation of the present invention, multiplier tiles 1100M–1102M are configured to multiply a signed multiplier Y3–Y0 and an unsigned multiplicand X3–X0. To accomplish this, the mechanism that processes the signed portion of multiplicand X3–X0 is disabled. More specifically, multiplexers 31X and 32X are coupled to receive logic "0" values instead of the X3 multiplicand bit. In addition, AND gates 19X–21X are programmed to provide logic "0" signals to the carry input terminals of adders 51X, 53X and 55X, respectively. Multiplexers 1147, 1148 and 1149 are configured to pass the carry signals received from adder circuits 60, 62 and 64, respectively. However, multiplexer 1112X remains programmed to route the carry signal provided by adder/subtractor 1166 to adder/subtractor 1157X. Multiplexer 1150 remains programmed to route the output signal provided by adder/subtractor 1157X. Multiplexers 1112X and 1150 are configured in this manner to provide a sign extension of product bit P6 (since the product of an unsigned multiplicand and a signed multiplier is a signed value). Multiplier tiles 1000M and 1100M are otherwise configured in the manner described above for a signed multiplication operation. Adders 51X–56X and adder/subtractor 1158X are not required when the multiplicand X is unsigned. Thus, if the multiplier circuit is expanded to include multiple columns, an extension multiplier tile such as multiplier tile 1102M is only required in the column which generates the most significant product bit.

In another variation, multiplier tiles 1100M–1102M are configured to multiply an unsigned multiplier Y3–Y0 and a signed multiplicand X3–X0. To accomplish this, the mechanism that processes the signed portion of multiplier Y3–Y0 is disabled. More specifically, adder/subtractor circuits 1157–1158, 1165–1166 and 1157X–1158X are configured to operate as adder circuits, rather than subtractor circuits. In addition, multiplexer 1122 is configured to route a logic "0" value to the carry input terminal of adder/subtractor circuit 1157. As a result, the "invert and add one" function is disabled. Multiplier tiles 1100M–1102M are otherwise configured in the manner described above for a signed multiplication operation.

As previously described, an additional upper adjacent multiplier tile 1102M is required to perform sign extensions at the top of the multiplier circuit when the multiplicand X or the multiplier Y is signed. Because multiplier tile 1102M is coupled to receive the most significant multiplicand bit X3 twice, the sign of the resulting product is extended by two bits, although only one extended sign bit is required. However, any delay caused by the generation of the extra extended sign bit is minimal.

Although multiplier tiles 1100M–1102M have been described as forming 4×4 multiplier circuits, in other embodiments, other numbers of these multiplier tiles can be used to create multiplier circuits of other sizes in accordance with the principles described above.

The above examples describe "carry-propagate" multiplier circuits. The term "carry-propagate" is used because of similarities between the operation of these multiplier circuits and the operation of sequential shift-and-add multipliers, where the carry signal propagates the full length of the adder in each addition. Some sequential shift-and-add multipliers use a "carry-save" scheme, where the carry signals do not propagate, but instead, are saved for inclusion in the next addition. The benefit of a carry-save technique is speed, since the accumulator need not wait for the carry signals to propagate. The primary difference between a carry-save array multiplier circuit and a carry propagate multiplier circuit is that the carry signals propagate horizontally, rather than vertically, through the multiplier circuit.

Figure 14:
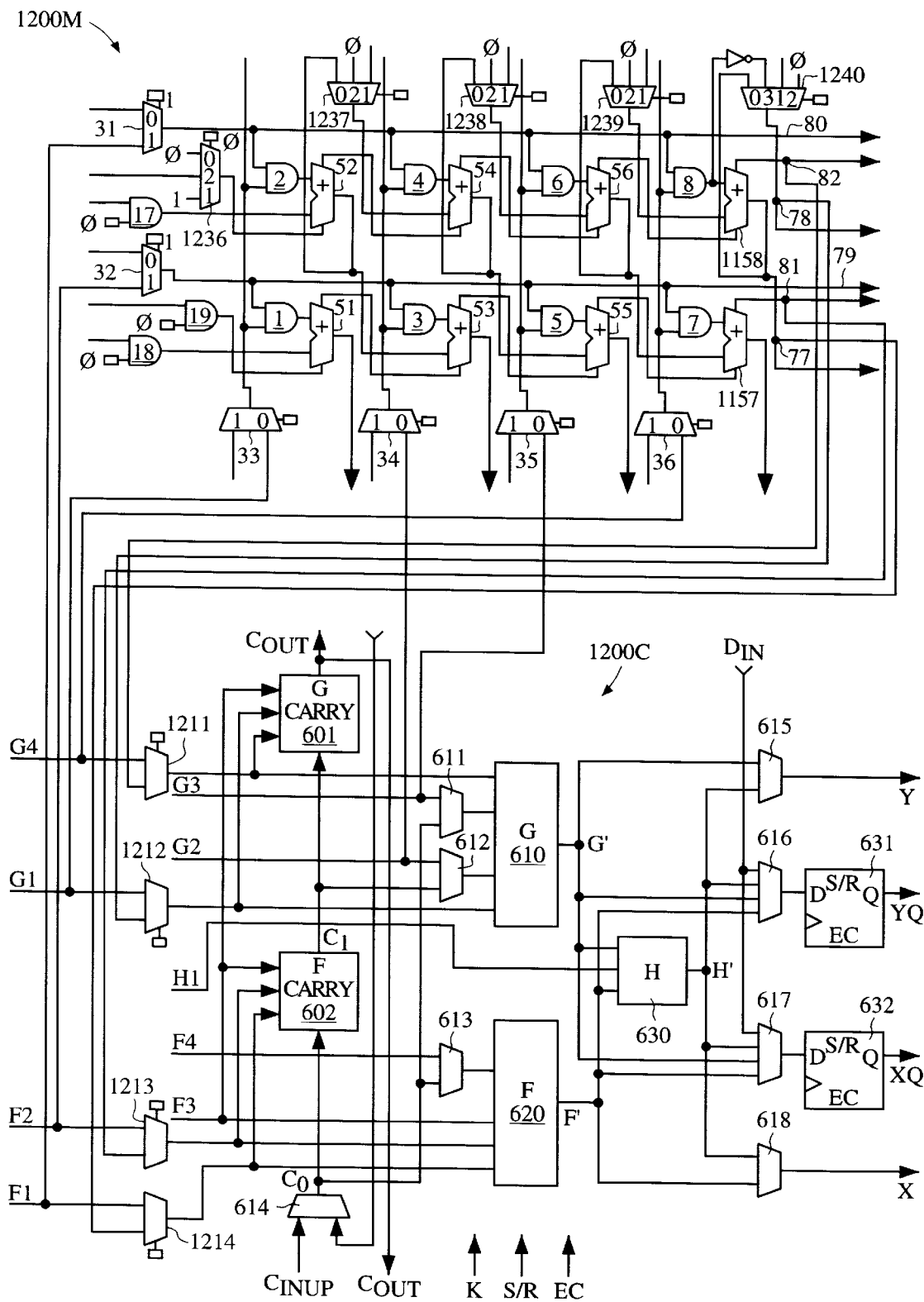
FIG. 14 is a circuit diagram illustrating a CLB having a multiplier tile which supports carry-save multiplication in accordance with another embodiment of the invention.

In another embodiment of the present invention, the previously described multiplier tiles are modified to enable a carry-save multiplier circuit. FIG. 14 is a circuit diagram illustrating a CLB 1200 in accordance with such an embodiment. CLB 1200 includes CLE 1200C and multiplier tile 1200M. Because CLE 1200C is largely identical to CLE 500C (FIG. 6), similar elements in FIGS. 6 and 14 are labeled with similar reference elements. In addition to the previously described elements of CLE 500C, CLE 1200C includes two-to-one multiplexers 1211–1214. When CLE 1200C is not connected to multiplier tile 1200M, multiplexers 1211–1214 are configured to pass the applied input signals F1, F2, G1 and G4. Conversely, when CLE 1200C is connected to multiplier tile 1200M, multiplexers 1211–1214 are configured to pass the signals received from multiplier tile 1200M. The reason for this is will become apparent in view of the subsequent disclosure.

Because multiplier tile 1200M is largely identical to multiplier tile 1100M (FIG. 12), similar elements in FIGS. 12 and 14 are labeled with similar reference elements. Thus, multiplier tile 1200M includes AND gates 1–8 and 17–19, multiplexers 31–36, adder circuits 51–56 and adder/subtractor circuits 1157–1158 and output terminals 77–80. In addition, multiplier tile 1200M includes multiplexers 1236–1240 and output terminals 81–82.

Multiplexers 1237–1240 are coupled to receive the output signals provided by adder circuits 52, 54, 56 and 1158, respectively. Multiplexers 1237–1240 are also coupled to receive a logic "0" signal, as well as a sum output signal from an upper adjacent multiplier tile (not shown). Multiplexer 1240 is also coupled to receive inverse of the signal provided by AND gate 8.

The carry output terminals of adder circuits 51–56 and adder/subtractor circuits 1157–1158 are routed horizontally within multiplier tile 1200M. More specifically, the carry output signals provided by adder circuits 51, 52, 53, 54, 55 and 56 are routed to the carry input terminals of adder circuits 53, 54, 55, 56 and adder/subtractor circuits 1157 and 1158, respectively. The carry output signals provided by adder/subtractor circuits 1157–1158, in turn, are provided as carry output signals on output terminals 81 and 82, respectively. Thus, these carry output signals are not added to their corresponding sum signals within the multiplier tile 1200M. As a result, multiplier tile 1200M provides two additional output signals to the CLE, when compared with the previously described multiplier tiles.

To form the final product, the carry output signal provided by adder/subtractor circuit 1158 must be added to the sum signal received by output terminal 78 (from the upper adjacent multiplier tile (not shown)) in order to create a final product bit. Similarly, the carry output signal provided by adder/subtractor circuit 1157 must be added to the sum signal provided by adder/subtractor circuit 1158 in order to create a final product bit. These addition operations are performed by the associated underlying CLE 1200C. More specifically, the above-described carry and sum signals are routed from output terminals 82, 78, 77 and 81 to multiplexers 1211–1214, respectively of CLE 1200C. Multiplexers 1211–1212, in turn, route the carry and sum signals from output terminals 82 and 78 to G function generator 610 and G carry logic 601. Similarly, multiplexers 1213–1214 route the carry and sum signals from output terminals 77 and 81 to F function generator 620 and F carry logic 602.

The F function generator 620 and F carry logic 602 are configured to perform an addition operation in response to the carry and sum signals received from multiplexers 1213–1214 and the carry signal C0 received from multiplexer 614. F function generator 620 provides the sum output signal, and F carry logic 602 provides the carry output signal. G function generator 610 and G carry logic 601 are configured in a similar manner to add the sum and carry signals received from multiplexers 1211–1212 and the carry signal C1 provided by F carry logic 602. The output signals provided by the F and G function generators 610 and 620 represent final product bits of the multiplication operation. These final product bits can be routed out of CLE 1200C through multiplexers 615–618 and/or flip flops 631–632.

Three-to-one multiplexer 1236 is coupled to selectively route a logic "0", a logic "1" or a carry signal to the carry input terminal of adder circuit 52. As described in more detail below, the logic "1" signal is routed by multiplexer 1236 to provide the required "add one" function when the multiplier is a signed number.

Figure 15:
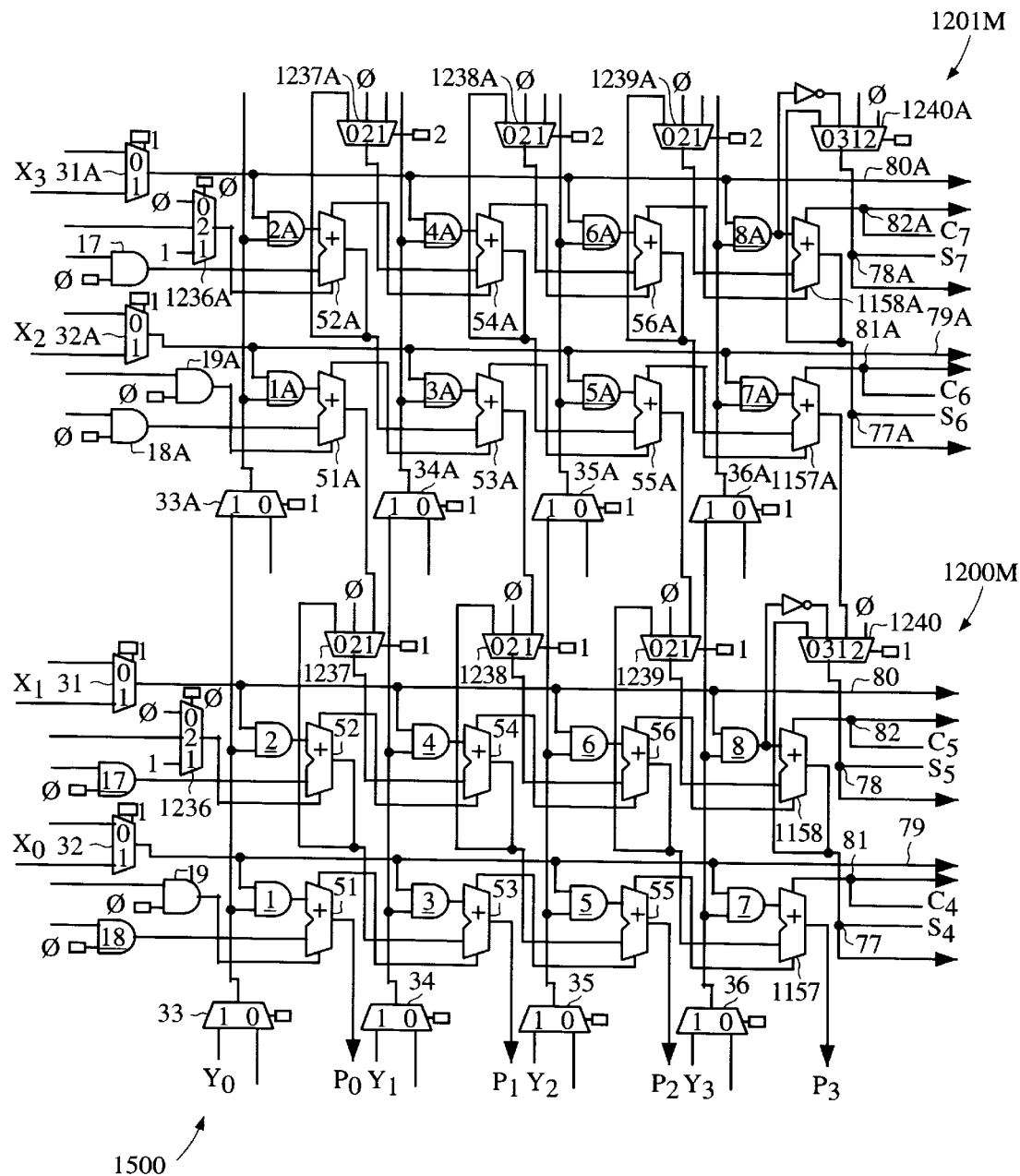
FIG. 15 is a circuit diagram of a 4×4 bit unsigned carry-save multiplier which uses the CLB of FIG. 14.

FIG. 15 is a circuit diagram of a 4×4 unsigned multiplier 1500 that uses multiplier tiles 1200M and 1201M to multiply an unsigned 4-bit multiplicand X3–X0 and a 4-bit unsigned multiplier Y3–Y0. The CLEs associated with multiplier tiles 1200M and 1201M are not illustrated for purposes of clarity. The least significant product bits P3–P0 are routed out of multiplier tile 1200M through two lower adjacent multiplier tiles (not shown) in the manner previously described. Multiplier bits Y3–YD are routed into multiplier tile 1200M through the CLE associated with multiplier tile 1200M in the manner previously described.

Because multiplier tile 1200M is identical to multiplier tile 1201M, similar elements in these two multiplier tiles are labeled with similar reference numbers. More specifically, the elements of multiplier tile 1201M are labeled with the same reference numbers as the elements of multiplier tile 1200M, followed by the letter "A".

Multiplier tiles 1200M and 1201M are configured as follows to implement an unsigned multiplier circuit. Multiplexers 31–32 and 31A–32A are programmed to route multiplicand bits X3–X0 from the associated CLEs to multiplier tiles 1200M and 1201M. Multiplexers 1237–1240 are configured to pass the output signals provided by adder circuits 51A, 53A, 55A and 1157A. The configuration memory cells associated with AND gates 17–19 and 17A–19A are programmed to provide logic "0" signals, thereby initializing adder circuits 51–52 and 51A–52A. Multiplexers 1236 and 1236A are configured to route logic "0" signals. Multiplexers 1237A–1240A are also configured to route logic "0" signals. Adder/subtractor circuits 1157–1158 and 1157A–1158A are configured to operate as adder circuits.

In this configuration, multiplier tiles 1200M and 1201M provide sum signals S7–S4, carry signals C7–C4, and product bits P3–P0. Product bits P3–P0 are routed to the two lower adjacent multiplier tiles (not shown) as the least significant product bits. Carry signal C4 is added to sum signal S4, and carry signal C5 is added to sum signal S5 within CLE 1200C, thereby creating product bits P4 and P5. Similarly, carry signal C6 is added to sum signal S6, and carry signal C7 is added to sum signal S7 within the CLE associated with multiplier tile 1201M, thereby creating product bits P6 and P7.

Multiplier tiles 1200M and 1201M can also be configured to multiply an unsigned multiplicand X3–X0 and a signed multiplier Y3–Y0. The configuration is the same as that described above for unsigned multiplication, except that adder/subtractor circuits 1157–1158 and 1157A–1158A are configured to operate as subtractor circuits, multiplexer 1236A is configured to pass a logic "1" signal, and multiplexer 1240A is configured to pass the inverse of the output signal provided by AND gate 8A. These modifications provide the "invert and add one" function required for the signed multiplier Y3–Y0. Note that the "add one" function is provided by multiplexer 1236A. Inputs to adders 52A and 1157 have the same weight. Thus, "adding one" in either location has the same effect. Routing the inverted output of AND gate 8A provides sign extension in the subtraction.

Figure 16:
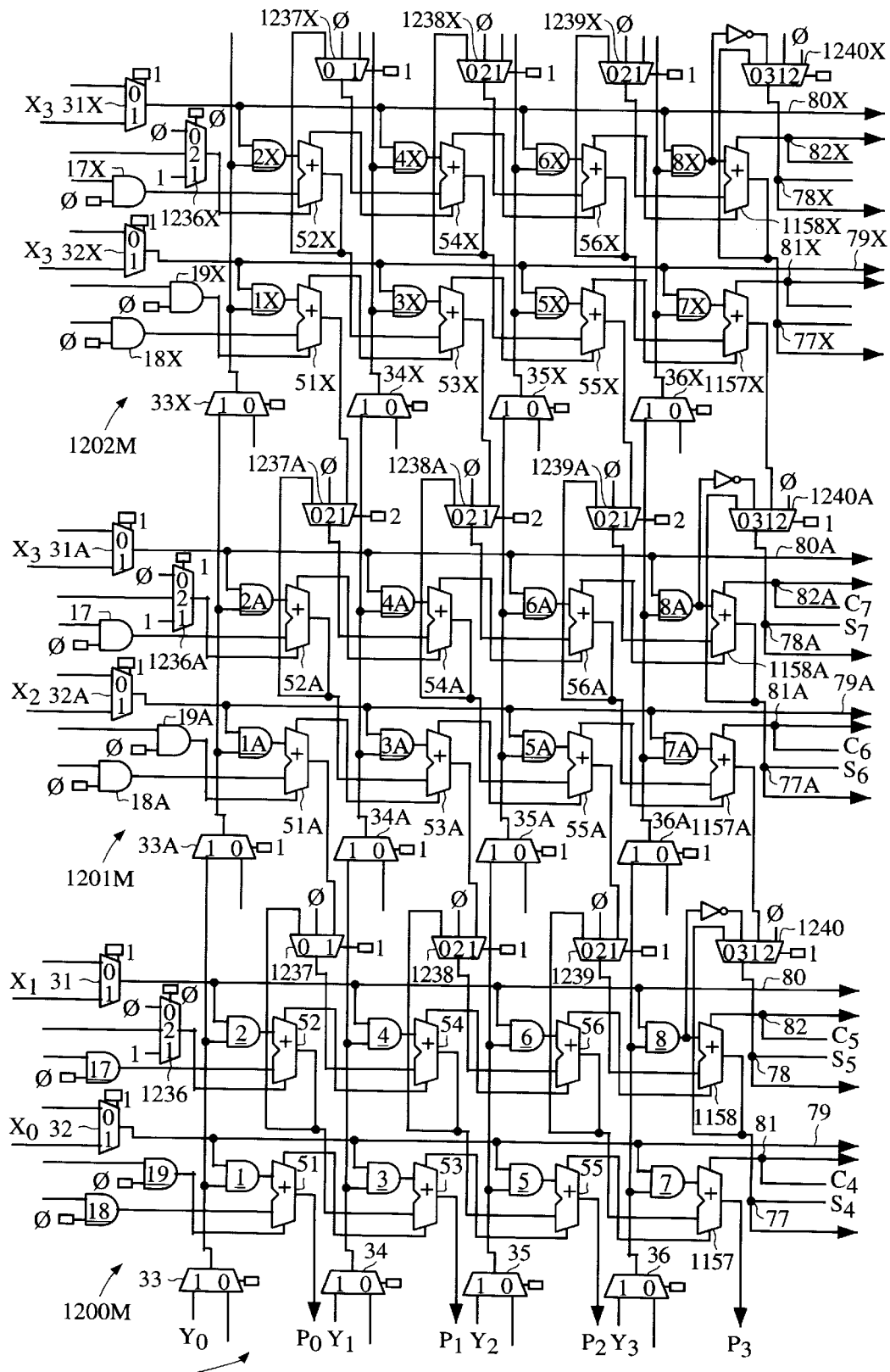
FIG. 16 is a circuit diagram of a 4×4 bit signed carry-save multiplier which uses the CLB of FIG. 14.

FIG. 16 is a circuit diagram of a multiplier 1600 that enables multiplicand X3–X0 to be a signed number. Multiplier circuit 1600 includes a third multiplier tile 1202M, which is identical to multiplier tiles 1200M and 1201M. Because multiplier tile 1200M is identical to multiplier tile 1202M, similar elements in these two multiplier tiles are labeled with similar reference numbers. More specifically, the elements of multiplier tile 1202M are labeled with the same reference numbers as the elements of multiplier tile 1200M, followed by the letter "X".

Multiplier tiles 1200M–1202M are configured as follows to implement a signed multiplier circuit. Multiplexers 31–32, 31A–32A and 31X–32X are programmed to route multiplicand bits X3–X0 from the associated CLEs to multiplier tiles 1200M, 1201M and 1202M. Note that multiplicand bit X3 is applied to multiplexers 31X–32X, thereby allowing multiplier tile 1202M to perform the sign extensions necessitated by the signed nature of multiplicand X3–X0. Multiplexers 1237–1240 are configured to route the output signals provided by adder circuits 51A, 53A, 55A and 1157A. Similarly, multiplexers 1237A–1240A are configured to route the output signals provided by adder circuits 51X, 53X, 55X and 1157X. The configuration memory cells associated with AND gates 17–19, 17A–19A and 17X–19X are programmed to provide logic "0" signals, thereby initializing adder circuits 51–52, 51A–52A and 51X–52X. Multiplexers 1236 and 1236X are configured to pass logic "0" signals. Multiplexer 1236A is configured to pass a logic "1" output signal, thereby providing the "add one" function required by the signed nature of multiplier Y3–YD. Adder/subtractor circuits 1157–1158, 1157A–1158A and 1157X–1158X are configured to operate as subtractor circuits, thereby providing the "invert" function required by the signed nature of multiplier Y3–Y0. Multiplexers 1237X, 1238X and 1239X are configured to route the output signals provided by adder circuits 52X, 54X and 56X, respectively. Multiplexer 1240X is configured to route the output signal provided by adder/subtractor circuit 1158X.

In this configuration, multiplier tiles 1200M–1202M provide product bits P3–P0, sum signals S7–S4 and carry signals C7–C4. Product bits P3–P0 are routed through two lower adjacent CLBs (not shown). Carry signal C4 is added to sum signal S4, and carry signal C5 is added to sum signal S5 within CLE 1200C, thereby creating two additional product bits P4 and P5. Similarly, carry signal C6 is added to sum signal S6, and carry signal C7 is added to sum signal S7 within the CLE associated with multiplier tile 1201M, thereby creating the two most significant product bits P6 and P7.

Multiplier tiles 1200M–1202M can also be configured to multiply a signed multiplicand X3–X0 and an unsigned multiplier Y3–Y0. The configuration is the same as that described above for signed multiplication, except that adder/subtractor circuits 1157–1158, 1157A–1158A and 1157X–1158X are configured to operate as adder circuits, and multiplexer 1236A is configured to pass a logic "0" output signal. These modifications cancel the "invert and add one" function that was required for the signed multiplier Y3–Y0.

Although the invention has been described in connection with several embodiments, it is understood that this invention is not limited to the embodiments disclosed, but is capable of various modifications which would be apparent to a person skilled in the art. For example, the present invention is applicable to multipliers which use different numbers of bits, as well as different types of multiplication algorithms (e.g., Booth's Algorithm). Thus, the invention is limited only by the following claims.

What is claimed is:

1. A programmable logic device comprising:
   an array of configurable logic elements (CLEs);
   an array of multiplier tiles; and
   programmable interconnect resources for selectively coupling each multiplier tile to an associated CLE and to adjacent multiplier tiles.

2. The programmable logic device of claim 1, further comprising programmable interconnect resources for selectively coupling the CLES.

3. The programmable logic device of claim 1, wherein each of the multiplier tiles comprises a plurality of adder circuits arranged in at least one column and at least one row.

4. The programmable logic device of claim 3, further comprising a logical AND gate coupled to each of the adder circuits.

5. The programmable logic device of claim 3, wherein at least one of the adder circuits also supports a subtractor functionality.

6. The programmable logic device of claim 1, wherein the programmable interconnect resources comprise a plurality of programmable multiplexers for selectively connecting or isolating each multiplier tile from an associated CLE.

7. The programmable logic device of claim 1, wherein the programmable interconnect resources comprise a plurality of programmable multiplexers for selectively connecting or isolating adjacent multiplier tiles.

8. The programmable logic device of claim 1, wherein the programmable interconnect resources selectively interconnect a plurality of multiplier tiles to form at least one larger multiplier circuit.

9. The programmable logic device of claim 1, wherein the programmable interconnect resources selectively propagate one or both of a sum signal and a carry signal between a plurality of multiplier tiles.

10. The programmable logic device of claim 1, wherein each of the multiplier tiles comprises:
    a first plurality of multiplexers for selectively routing multiplier bits from an adjacent multiplier tile or from an associated CLE; and a second plurality of multiplexers for selectively routing multiplicand bits from an adjacent multiplier tile or from an associated CLE.

11. The programmable logic device of claim 1, wherein the multiplier tiles support unsigned multiplication.

12. The programmable logic device of claim 11, wherein the multiplier tiles support signed multiplication.

13. The programmable logic device of claim 1, wherein each of the CLEs comprises:

a programmable function generator; and a programmable carry logic circuit.

14. The programmable logic device of claim 1, wherein the multiplier tiles are configured to perform carry-propagate multiplication.

15. The programmable logic device of claim 1, wherein the multiplier tiles are configured to perform carry-save multiplication.

16. The programmable logic device of claim 15, wherein each of the CLEs comprises adder circuitry for adding signals generated by an associated multiplier tile.

17. A method of operating a programmable logic device, the method comprising the steps of:

providing an array of configurable logic elements (CLEs) and an array of multiplier tiles;

selectively coupling a first set of the multiplier tiles to form a multiplier circuit;

coupling a first subset of multiplier tiles within the first set of multiplier tiles to a first subset of associated CLES;

routing multiplier signals and multiplicand signals from the first subset of CLEs to the first subset of multiplier tiles;

coupling a second subset of multiplier tiles within the first set of multiplier tiles to a second subset of associated CLEs; and routing product signals from the second subset of multiplier tiles to the second subset of CLEs.

18. The method of claim 17, further comprising the step of multiplying an unsigned multiplier and an unsigned multiplicand within the first set of multiplier tiles.

19. The method of claim 17, further comprising the step of multiplying a signed multiplier and an unsigned multiplicand within the first set of multiplier tiles.

20. The method of claim 17, further comprising the step of multiplying a signed multiplier and a signed multiplicand within the first set of multiplier tiles.

21. The method of claim 17, further comprising the step of multiplying a unsigned multiplier and a signed multiplicand within the first set of multiplier tiles.

22. The method of claim 17, further comprising the step of performing a carry-propagate multiplication operation within the first set of multiplier tiles.

23. The method of claim 17, further comprising the step of performing a carry-save multiplication operation within the first set of multiplier tiles.

24. The method of claim 23, further comprising the step of adding carry and save signals generated by the carry-save multiplication operation within the second subset of CLEs.

* * * * *